(12) United States Patent
Merrill

(10) Patent No.: US 6,930,336 B1
(45) Date of Patent: Aug. 16, 2005

(54) VERTICAL-COLOR-FILTER DETECTOR GROUP WITH TRENCH ISOLATION

(75) Inventor: Richard B. Merrill, Woodside, CA (US)

(73) Assignee: Foveon, Inc., Santa Clara, CA (US)

( * ) Notice: Subject to any disclaimer, the term of this patent is extended or adjusted under 35 U.S.C. 154(b) by 159 days.

(21) Appl. No.: 10/346,647

(22) Filed: Jan. 17, 2003

Related U.S. Application Data

(63) Continuation-in-part of application No. 09/884,863, filed on Jun. 18, 2001, now Pat. No. 6,727,521.

(51) Int. Cl.[7] .............................................. H01L 31/062
(52) U.S. Cl. ....................... 257/292; 257/291; 348/272; 348/273; 348/274; 348/277
(58) Field of Search .............................. 257/55, 57, 98, 257/291, 427, 449, 458, 463; 250/208.1, 214.1, 226; 348/272–274, 277, 300–302, 308, 311

(56) References Cited

U.S. PATENT DOCUMENTS

| | | | |
|---|---|---|---|
| 3,971,065 A | 7/1976 | Bayer .......................... 358/41 |
| 4,011,016 A | 3/1977 | Layne et al. ................. 356/195 |
| 4,238,760 A | 12/1980 | Carr ............................ 357/30 |
| 4,309,604 A | 1/1982 | Yoshikawa et al. .......... 250/226 |
| 4,318,115 A | 3/1982 | Yoshikawa et al. ............ 357/30 |
| 4,613,895 A | 9/1986 | Burkey et al. ................. 358/41 |
| 4,651,001 A | 3/1987 | Harada et al. ............... 250/330 |
| 4,677,289 A | 6/1987 | Nozaki et al. ............... 250/226 |
| 4,772,335 A | 9/1988 | Huang .......................... 136/258 |
| 5,397,734 A | 3/1995 | Iguchi et al. .................. 437/70 |
| 5,502,299 A | 3/1996 | Standley ................... 250/208.2 |
| 5,608,243 A | 3/1997 | Chi et al. .................... 257/249 |
| 5,668,596 A | 9/1997 | Vogel .......................... 348/222 |
| 5,739,562 A | 4/1998 | Ackland et al. ............. 257/291 |
| 5,872,371 A | 2/1999 | Guidash et al. ............. 257/230 |
| 5,877,521 A * | 3/1999 | Johnson et al. ............. 257/223 |
| 5,883,421 A | 3/1999 | Ben Chouikha et al. .... 257/461 |

(Continued)

FOREIGN PATENT DOCUMENTS

| | | | | |
|---|---|---|---|---|
| EP | 0 605 898 | 7/1994 | ......... H01L/27/146 |
| JP | 61-187282 | 8/1986 | ........... H01L/31/10 |
| JP | 01-134966 | 5/1989 | .......... H01L/27/14 |
| WO | WO 98/19455 | 5/1998 | ............ H04N/3/15 |

OTHER PUBLICATIONS

S. Chamberlain, "Photosensitivity and Scanning of Silicon Image Detector Arrays", *IEEE Journal of Solid–State Circuits*, vol. SC–4, No. 6, pp. 333–342, Dec. 1969.

B.C. Burkey et al., "The Pinned Photodiode For An Interline–Transfer CCD Image Sensor", *International Electron Devices Digest of Technical Papers (IEDM)*, pp. 84–28—84–31, Dec. 1984.

(Continued)

*Primary Examiner*—Minhloan Tran
*Assistant Examiner*—Thomas L. Dickey
(74) *Attorney, Agent, or Firm*—Sierra Patent Group, Ltd.

(57) ABSTRACT

A vertical-color-filter detector group comprises a semiconductor body including a plurality of alternating silicon layers of first and second conductivity types, the second conductivity type being opposite that of the first conductivity type, formed over a substrate of the first conductivity type. Each of the layers of the second conductivity type are disposed at a depth from an upper surface of the silicon body selected to preferentially absorb radiation of a selected color, there being at least first and second layers of the second conductivity type. First and second conductive contacts extend, respectively, from the first and second layers of the second conductivity type to the upper surface of the silicon body. A peripheral isolation trench defines a perimeter of the detector group.

37 Claims, 24 Drawing Sheets

U.S. PATENT DOCUMENTS

| | | | | |
|---|---|---|---|---|
| 5,889,315 | A | | 3/1999 | Farrenkopf et al. .......... 257/552 |
| 5,899,714 | A | | 5/1999 | Farrenkopf et al. .......... 438/202 |
| 5,965,875 | A | * | 10/1999 | Merrill ........................ 250/226 |
| 5,982,012 | A | * | 11/1999 | Merrill ........................ 257/463 |
| 6,066,510 | A | | 5/2000 | Merrill ......................... 438/57 |
| 6,078,037 | A | | 6/2000 | Booth, Jr. ................ 250/208.1 |
| 6,111,300 | A | | 8/2000 | Cao et al. .................... 257/440 |
| 6,410,899 | B1 | | 6/2002 | Merrill et al. ............ 250/208.1 |
| 6,608,338 | B2 | * | 8/2003 | Rhodes ........................ 257/292 |
| 6,727,521 | B2 | | 4/2004 | Merrill ......................... 257/98 |
| 6,731,397 | B1 | | 5/2004 | Merrill et al. ............. 358/1.16 |
| 2004/0185597 | A1 | | 9/2004 | Merrill et al. ................ 438/70 |

OTHER PUBLICATIONS

R. Wolffenbuttel et al., "A Novel Approach to Solid–state Colour Sensing", *Sensors and Actuators*, vol. 9, pp. 199–211, 1986 (no month).

R. Wolfenbuttel et al., "Performance of an Integrated Silicon Colour Sensor with a Digital Output in Terms of Response to Colours in the Colour Triangle", *Sensors and Actuators*, vol. A21–A23, pp. 574–580, 1990 (no month).

P. Seitz et al., "Smart optical and image sensors fabricated with industrial CMOS/CCD semiconductor processes", *SPIE*, vol. 1900, pp. 21–30, Jan. 1993.

J. Kramer, "Photo–ASICs: Integrated Optical Metrology Systems with Industrial CMOS Technology", *Doctorial Dissertation; Diss Eth Nr. 10186*. MSc Imperial College of Science and Technolgy, pp. 1–91, 1993.

M. Chouikha, "Color sensitive photodetectors in standard CMOS and BiCMOS technologies", *SPIE*, vol. 2950, pp. 108–120, Aug. 1996.

H. Wong, "Technology and Device Scaling Considerations for CMOS Imagers", *IEEE Transactions on Electron Devices*, vol. 43, No. 12, pp. 2131–2142, Dec. 1996.

K. Parulski et al., "Enabling technologies for a family of digital cameras", *SPIE*, vol. 2654, Paper 18, pp. 156–163, 1996 (no month).

B. Weibel, "High–end digital cameras can make professional indoor photography a snap", *Buyers Guide*, pp. 311–317, Apr. 1997.

D. Sutherland, "Neaveau Niche–Part 1: The Latest in digital SLRs", *Shutterbug*, pp. 200–202, 208, 210, Nov. 1997.

M. Chouikha, "Buried Triple p–n Junction Structure in a BiCMOS Technology for Color Detection", *IEEE BCTM 6.4*, pp. 108–111, 1997 (no month).

A. Theuwissen, "Fundamentals of Solid–State Imaging", in Chapter 5 of Solid–State Imaging with Charge–Coupled Devices, pp. 131–141, 1995 Reprinted with corrections 1996,1997.

R. Guidash et al., "A 0.6 $\mu$m CMOS Pinned Photodiode Color Imager Technology", *IEDM*, pp. 97–927, 97–929, 1997 (no month).

D. Knipp et al., "Low Cost Approach to Realize Novel Detectors for Color Recognition", *Proc. ICPS 98* (International Congress on Imaging Science), pp. 350–353, Sep. 1998.

H. Miura et al., "A 100 Frame/s CMOS Active Pixel Sensor for 3D–Gesture Recognition System" 1999 IEEE International Solid–State Circuits Conference, pp. 142–143, Jun. 1999.

Stiebig et al., Transient Behavior of Optimized nipiin Three-Color Detectors, *IEEE Transactions on Electron Devices*, vol. 45, No. 7, pp. 1438–1443, Jul. 1998.

* cited by examiner

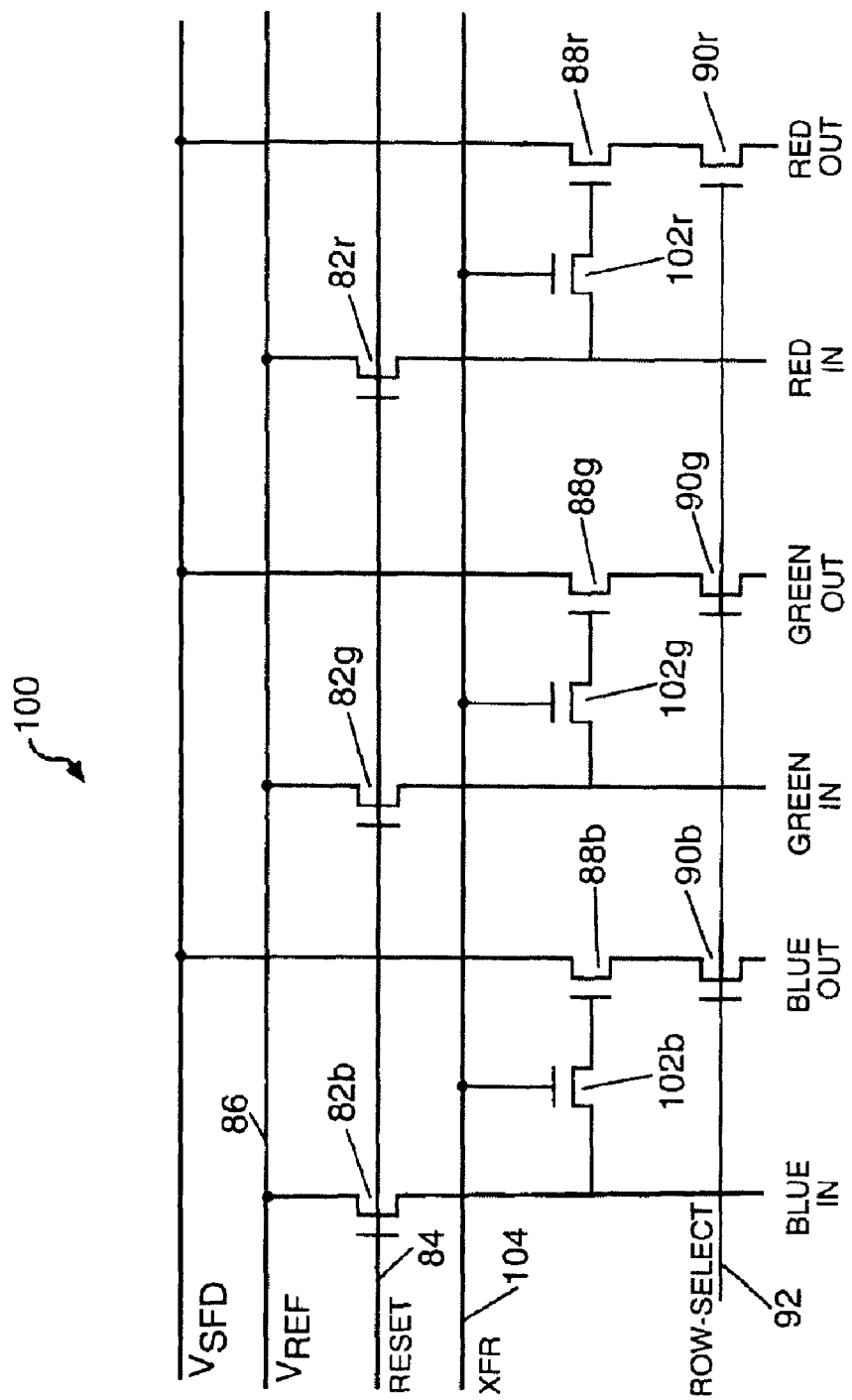

VERTICAL-COLOR-FILTER DETECTOR GROUP WITH TRENCH ISOLATION

RELATED APPLICATIONS

This application is a continuation-in-part of prior application Ser. No. 09/884,863 filed on Jun. 18, 2001 now U.S. Pat. No. 6,727,521, and assigned to the same assignee as the present invention.

BACKGROUND OF THE INVENTION

1. Field of the Invention

The present invention relates to the capture of digital images. More particularly, the present invention relates to vertical-color-filter detector groups and arrays thereof. More particularly, the present invention relates to arrays of detector groups wherein each of the detector groups is a multilayer junction structure to ensure that each pixel sensor in the array measures each of the three primary colors (R-G-B) in the same location and image-capture devices such as digital cameras employing such arrays.

2. The Prior Art

Semiconductor devices for measuring the color of light are known in the non-imaging art. These devices have been built with a variety of technologies that depend upon the variation of photon absorption depth and wavelength. Examples are disclosed in U.S. Pat. No. 4,011,016 entitled "Semiconductor Radiation Wavelength Detector" and U.S. Pat. No. 4,309,604 entitled "Apparatus for Sensing the Wavelength and Intensity of Light." Neither patent discloses either a structure for a three-color integrated-circuit color sensor or an imaging array.

In the imaging art, CCD devices with multiple buried channels for accumulating and shifting photo charges are known. These devices are difficult and expensive to manufacture and have not been practical for three-color applications. U.S. Pat. No. 4,613,895 entitled "Color Responsive Imaging Device Employing Dependent Semiconductor Optical Absorption" discloses an example of such a device. This category also includes devices that use layers of thin film photosensitive materials applied on top of an imager integrated circuit. Examples of this technology are disclosed in U.S. Pat. No. 4,677, 289 entitled "Color Sensor" and U.S. Pat. No. 4,651,001 titled "Visible/Infrared Imaging Device with Stacked Cell Structure." These structures are also difficult and expensive to produce and have not become practical.

Also known in the imaging art are color-imaging integrated circuits that use a color filter mosaic to select different wavelength bands at different photo sensor locations. U.S. Pat. No. 3,971,065, entitled "Color Imaging Array", discloses an example of this technology. As discussed in Parluski et al., "Enabling Technologies for a Family of Digital Camera", 156/SPIE Vol. 2654, 1996 one pixel mosaic pattern commonly utilized in Digital cameras is the Bayer Color Filter Array (CFA) pattern.

Shown in FIG. 1, the Bayer CFA has 50% green pixels arranged in a checkerboard. Alternating lines of red and blue pixels are used to fill in the remainder of the pattern. Color overlay filters are employed to produce the color selectivity between the red, green, and blue sensors. Such sensors have the disadvantage of occupying a relatively large area per pixel as these sensors are tiled together in a plane. As shown in FIG. 2, the Bayer CFA pattern results in a diamond shaped Nyquist domain for green and smaller, rectangular shaped Nyquist domains for red and blue. The human eye is more sensitive to high spatial frequencies in luminance than in chrominance and luminance is composed primarily of green light. Therefore, since the Bayer CFA provides the same Nyquist frequency for the horizontal and vertical spatial frequencies as a monochrome imager, the Bayer CFA improves the perceived sharpness of the digital image.

Mosaic approaches are well known in the art to be associated with aliasing problems due to the sensors being small compared to the spacing between sensors so that the sensors locally sample the image signal, and that the sensors for different colors are in different locations, so that the samples may not align between colors.

As pointed out above in the discussion of CCD color imaging arrays, the semiconductor processes employed in manufacturing arrays can be both difficult and expensive to implement. There are, however, CMOS technologies that are known that may be implemented with less expense and greater ease.

Another type of multiple-wavelength sensor employs more than one sensor in a vertically-oriented group. An example of an early multiple-wavelength vertical-color-filter sensor group for detecting visible and infrared radiation is disclosed in U.S. Pat. No. 4,238,760 issued to Carr, in which a first diode in a surface n-type epitaxial region is responsive to visible light and a second buried region in an underlying n-type substrate is responsive to infrared radiation. Contact to the buried photodiode is made using deep diffusion processes similar to diffusion-under-film collector contact common in bipolar IC processing and for $R_{cs}$ reduction. The disclosed device has a size of 4 mils square. An alternative embodiment employs V-groove MOS transistor contacts to contact the buried p-type region of the infrared diode.

The device disclosed in the Carr patent has several shortcomings, the most notable being its large area, rendering it unsuitable for the image sensor density requirements of modern imaging systems. The technology employed for contact formation to the buried infrared sensing diode is also not suitable for modern imaging technology or extension to a three-color sensor.

Referring to FIG. 3, many modern CMOS integrated circuit fabrication processes use a "twin-well" or "twin-tub" process in which a P well region 10 and a N well region 12 of doping density of approximately $10^{17}$ atoms/cm$^3$ are used in regions within which to make N-channel and P-channel transistors respectively. The substrate material 14 is typically a lightly-doped P-type silicon ($10^{15}$ atoms/cm$^3$), so P well 10 is not isolated from substrate 14. The N-channel FET 16 formed in P-well 10 includes N+ normal source/drain diffusions 18 at a dopant concentration of >$10^{18}$ atoms/cm$^3$ and N-type shallow Lightly-Doped-Diffusion (LDD) regions 20 at a concentration of approximately $10^{18}$ atoms/cm$^3$. The P-channel FET 22 formed in N well region 12 is similarly constructed using normal P+ source/drain regions 24 and shallow LDD regions 26 of similar dopant concentrations.

Referring to FIG. 4, in an improved process, known as "triple-well", an additional deep N isolation well 28 is used to provide well isolation between the P well 10 and substrate 14 ($10^{15}$ atom/cm$^3$ respectively). structures in FIG. 4 corresponding to structures in FIG. 3 are identified by the same reference numerals used in FIG. 3. U.S. Pat. No. 5,397,734 titled "Method of Fabricating a Semiconductor Device Having a Triple-well Structure", discloses an example of triple-well technology.

Triple-well processes are becoming popular and economical for manufacturing MOS memory (DRAM) devices, since triple-well processes provide effective isolation of dynamic charge storage nodes from stray minority carriers that may be diffusing through the substrate.

A particular example of a three-color visible-light prior art vertical-pixel-sensor group shown in FIG. 5 is disclosed in U.S. Pat. No. 5,965,875 to Merrill. In Merrill, a structure is provided using a triple-well CMOS process including n-well 30 in p-type substrate 32, p-well 34 in n-well 30, and lightly-doped-drain region 36 disposed in p-well 34. The blue, green, and red sensitive PN junctions are seen disposed at different depths beneath the surface of the semiconductor substrate upon which the imager is fabricated.

BRIEF DESCRIPTION OF THE INVENTION

According to one aspect of the present invention, a vertical-color-filter detector group and an imaging array of such groups is provided. The term "vertical color filter" is meant to convey that color filtering is implemented by propagation of light vertically through the semiconductor material of the sensor group and array, while "detector group" is meant to imply that several values, typically three color channels, are sensed at the same picture element location of each group in the array. The detector group with three sets of active-pixel-sensor readout circuitry occupies one pixel location in the array, and is sometimes referred to herein as a pixel sensor, a vertical-color-filter pixel sensor, or a color pixel sensor. A plurality of individual vertical-color-filter detector groups of the present invention are disposed in an imaging array of such groups and are isolated from one another by trench isolation structures. The trench isolation structures completely surround each individual vertical-color-filter detector group to isolate it from its neighbors and preferably extend from a surface layer of the vertical-color-filter detector group to the underlying silicon substrate. The trench walls may be doped to the same conductivity type as the substrate and may be filled with either an insulating material or with polysilicon doped to the same conductivity type as the substrate.

One vertical-color-filter detector group that is particularly useful in the present invention comprises a plurality of detector layers formed on a semiconductor substrate and configured by doping and/or biasing to collect photo-generated carriers of a first polarity, preferably negative electrons, separated by additional intervening layers configured to conduct away photo-generated carriers of the opposite polarity, preferably positive holes. The detection layers have different spectral sensitivities based upon different depths in the semiconductor substrate, doping levels, and biasing conditions. The detector layers are individually connected to active-pixel-sensor readout circuits. In one example of such a detector group, each detector group includes a blue photodetector n-type layer at the surface of the semiconductor, a green photodetector n-type layer deeper in the semiconductor, and a red photodetector n-type layer deepest in the semiconductor.

According to one aspect of the present invention, the vertical-color-filter detector group is isolating from its surroundings, or from other identical detector groups, by a deep isolation trench. According to another aspect, one or more buried detector layers is contacted by a contact trench.

According to an illustrative example, a vertical-color-filter detector group is formed on a semiconductor substrate and comprises at least six layers of alternating p-type and n-type doped regions. One of the regions may be the substrate. PN junctions between the layers operate as photodiodes with spectral sensitivities that depend on the absorption depth versus the wavelength of light in the semiconductor. Alternate layers, preferably the n-type layers, are detector layers to collect photo-generated carriers. The intervening layers, preferably the p-type layers, are reference layers and are connected in common to a reference potential referred to as ground. Active devices for active pixel sensor circuits are preferably formed in a top one of the intervening layers, or in a similar layer outside the area of the detector group itself. Trench isolation structures surround each individual vertical-color-filter detector group to isolate it from its neighbors and preferably extend from a surface isolation layer of the vertical-color-filter detector group to the underlying silicon substrate, that is, at least to a depth greater than the depth of the deepest detection layer. The trench walls may be doped to the same conductivity type as the substrate and may be filled with either an insulating material or with polysilicon doped to the same conductivity type as the substrate.

BRIEF DESCRIPTION OF THE DRAWING FIGURES

FIGS. 8A and 8B are schematic diagrams depicting transistor circuitry that may be used, respectively, in a non-storage version and a storage version of the vertical-color-filter pixel of the present invention to which the red, green, and blue photodiodes are coupled.

DETAILED DESCRIPTION OF THE INVENTION

Figure 1:
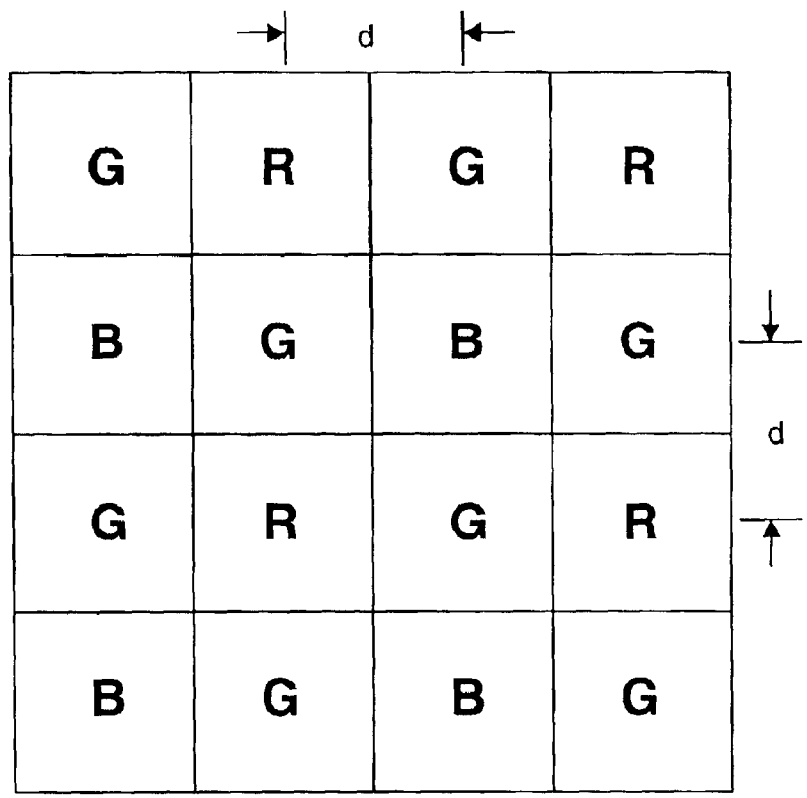
FIG. 1 is a diagram illustrating the well-known Bayer color filter array (CFA) pattern.
Figure 2:
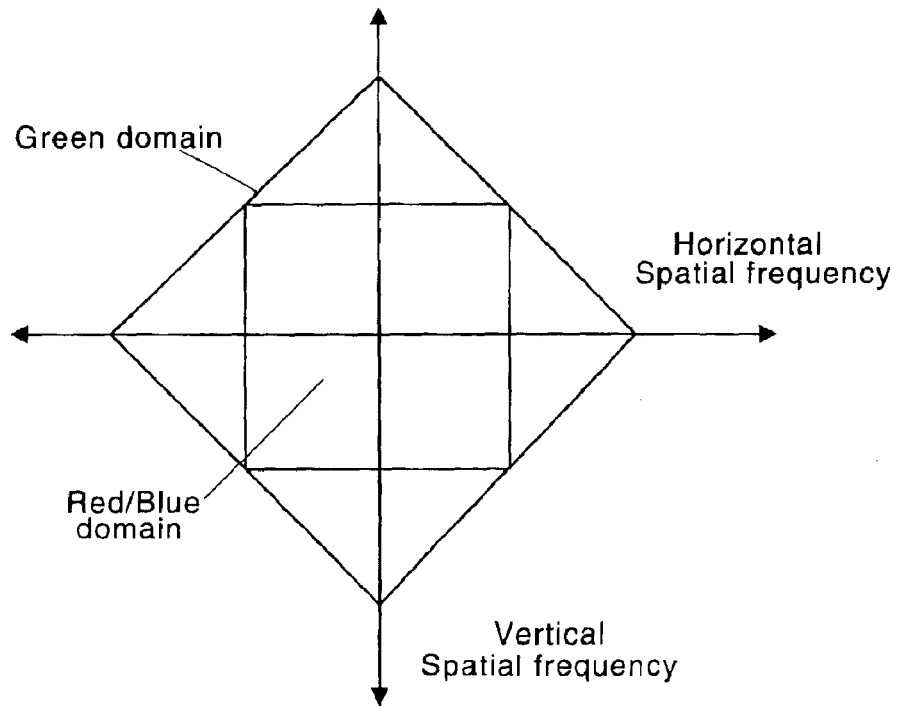
FIG. 2 is a diagram illustrating the Nyquist domains for red, green and blue resulting from the Bayer CFA of FIG. 1.
Figure 3:
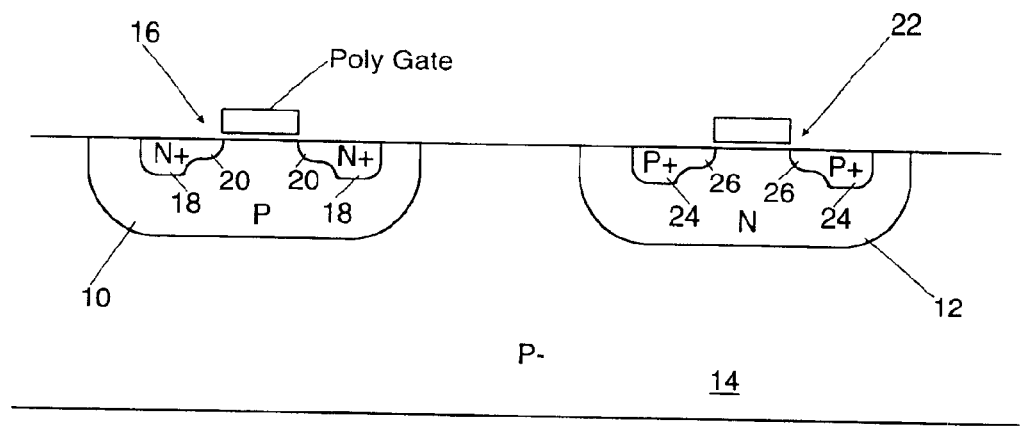
FIG. 3 is a diagram illustrating a partial cross section drawing showing a conventional twin-well CMOS structure.
Figure 4:
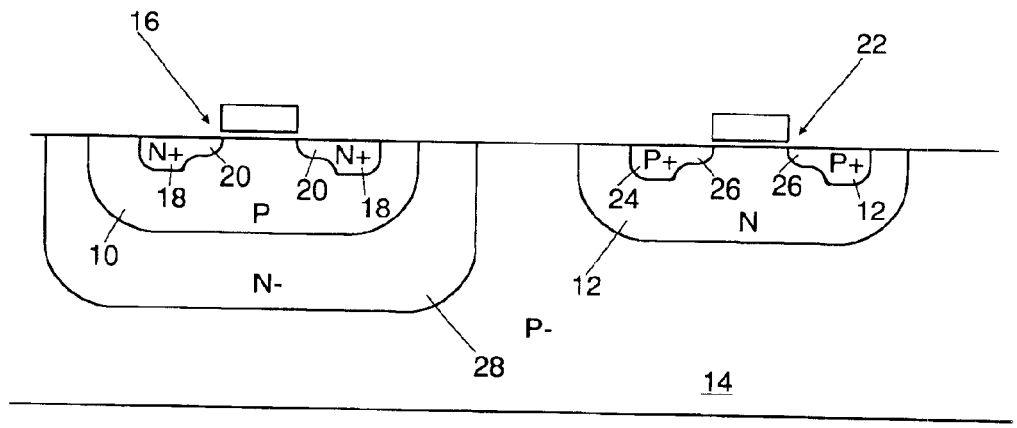
FIG. 4 is a diagram illustrating a partial cross section drawing showing a conventional triple-well CMOS structure.
Figure 5:
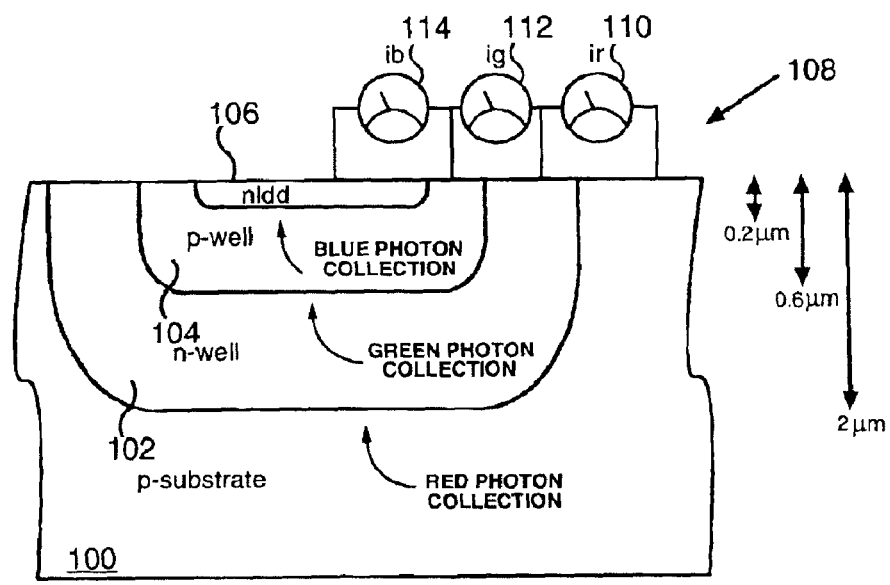
FIG. 5 is a partial cross sectional view of a conventional three-color vertical-color-filter pixel sensor using a triple-junction structure.

Persons of ordinary skill in the art will realize that the following description of the present invention is only illustrative and not in any way limiting. Other embodiments of this invention will be readily apparent to those skilled in the art having benefit of this disclosure.

The advantage of a vertical-color-filter detector group is that each pixel location in the array measures each primary color at the same location, thus minimizing or eliminating the need for interpolation. A further advantage of a full RGB imager formed from vertical-color-filter detector groups is that all of the red, green, and blue image information captured for a single pixel location is contained within a smaller space than in the pixel cluster of prior art imaging systems. This smaller space for capture allows finer resolution of the image.

In a typical system in accordance with this invention, the full RGB vertical-color-filter detector group imager may consist of, for example, an array of 640 by 480 vertical-color-filter detector groups that delivers a total of M=921,600 individual bytes of pixel data in the image data set. An illustrative non-limiting example of a denser imager that may be used in accordance with this invention is an imager array that includes an array of 3,000 by 2,000 vertical-color-filter detector group (x3 R, G, B,) for a total of M=18,000,000 bytes of pixel data in the image data set.

The vertical-color-filter detector group imager reduces color-aliasing artifacts by ensuring that all pixel locations in an imaging array measure red, green, and blue color response in the same place of the array structure. Color filtration takes place by making use of the difference in absorption length in silicon of red, green, and blue light.

The vertical-color-filter detector group imager provides advantages in addition to color aliasing. For example, the vertical-color-filter detector group imager eliminates the complex polymer-color-filter-array process steps common in the prior art. The imager also increases the overall efficiency in the use of the available photons. With the traditional approach, photons not being passed by the filter material are absorbed in the filter and wasted. With the approach of this invention, the photons are separated by absorption depth, but most all are collected and used. This can result in overall improvement in quantum efficiency by a factor of three.

The vertical-color-filter detector group imager of this invention benefits from the availability of scaled CMOS processing in the sense that there are many support transistors in each three-color pixel.

It is well known that the longer the wavelength of light incident upon a silicon body, the deeper the light will penetrate into the silicon body before it is absorbed. As depicted, the blue light having wavelengths in the range of about 400–490 nm will be absorbed in a silicon body at a depth of about 0.2–0.5 microns, green light having wavelengths of about 490–575 nm will be absorbed in the silicon body at a depth of about 0.5–1.5 micron, and red light having wavelengths in the range of about 575–700 nm will be absorbed in the silicon at a depth of about 1.5–3.0 microns.

Figure 6:
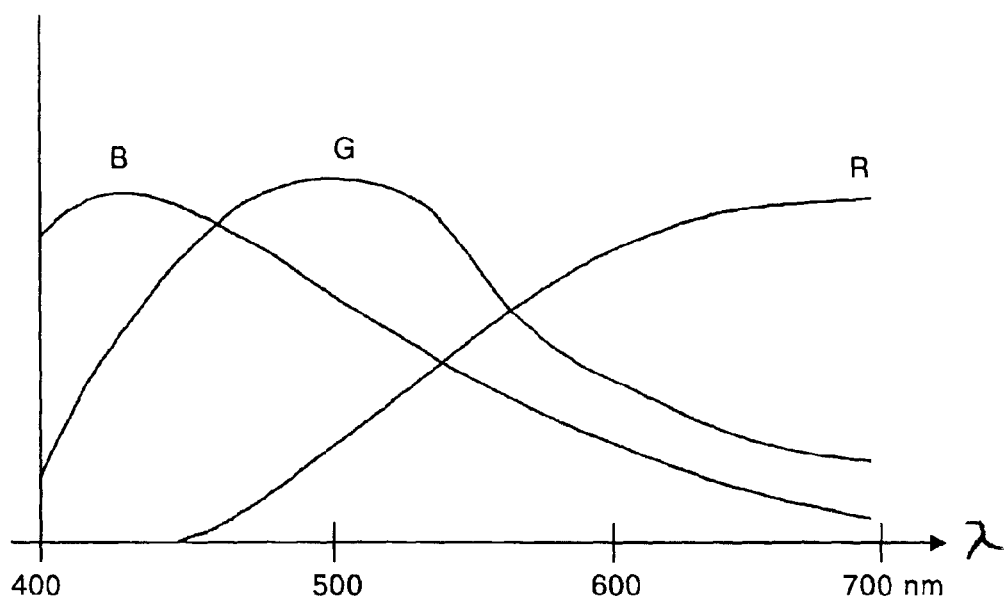
FIG. 6 is a graph showing a set of estimated sensitivity curves for the vertical-color-filter detector group of the present invention.

FIG. 6 presents a set of estimated sensitivity curves for the triple-stacked photodiode arrangement of this invention, as a function of wavelength within the visible spectrum. The curves are only rather broadly tuned, as shown, rather than sharply tuned as in some color separation approaches that are based on color filters. However, as is well known in the art of color imaging, it is possible with suitable matrixing to convert three-color measurements from such a set of curves into a more nearly colormetrically correct set of red green, and blue intensity values. Methods for estimating suitable matrix transformations are known in the art, and are disclosed, for example in U.S. Pat. No. 5,668,596, entitled "Digital Image Device Optimized for Color Performance."

Figure 7:
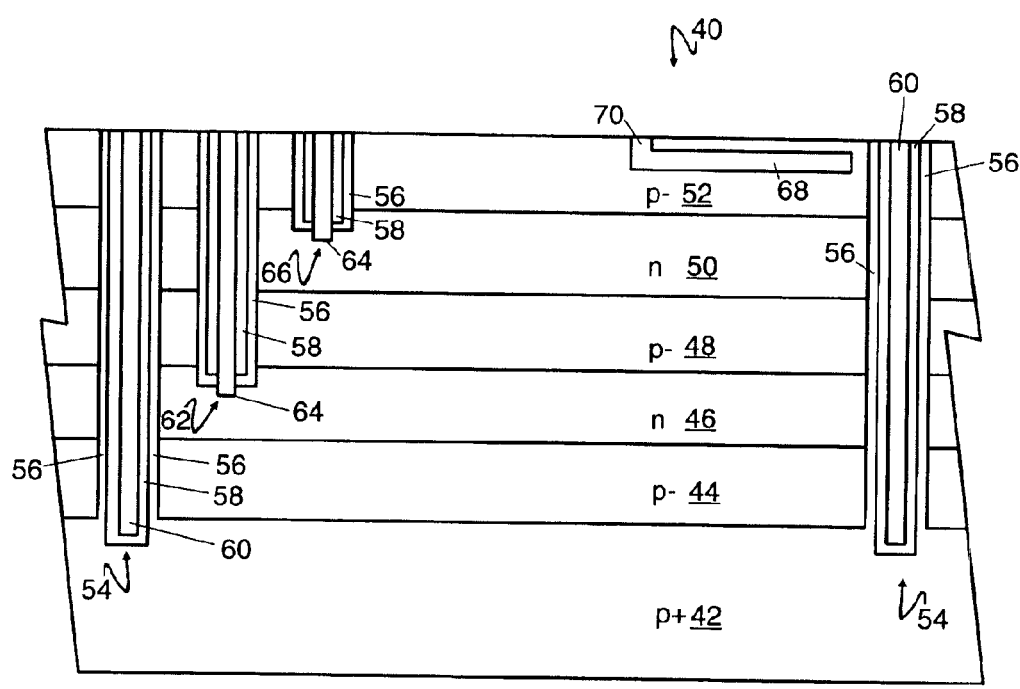
FIG. 7 is a semiconductor cross sectional diagram of an illustrative vertical-color-filter detector group with trench isolation according to the invention.

FIG. 7 illustrates an illustrative and non-limiting example of a vertical-color-filter detector group with trench isolation that may be used to practice the present invention. Vertical-color-filter detector group 40 is a six-layer structure that is shown schematically in cross-sectional view fabricated on p-type semiconductor substrate 42. The vertical-color-filter detector group of the present invention can be fabricated in a number of different ways and is thus generally shown in FIG. 7.

P-type substrate 42 may comprise, for example, a 0.01 ohm-cm p-type wafer. According to an illustrative embodiment of the invention, a layer 44 of approximately 2 microns of 10-ohm-cm p-type silicon is disposed over substrate 42 and may be formed by methods such as epitaxial deposition on p-type substrate 42.

An n-type layer 46 is disposed over p-type layer 44, and may be doped to about 1e16. Layer 46 serves as the red detector. A p-type layer 48, which may be doped to about 1e15 is disposed over n-type layer 46. An n-type layer 50 is disposed over p-type layer 48, and may be doped to about 1e16. Layer 50 serves as the green detector. A p-type layer 52, which may be doped to about 1e15 is disposed over n-type layer 50.

Layers 44, 46, 48, 50, and 52 may be epitaxial layers and may be grown in a single pass in an epitaxial rector by changing the gas flow back and forth between n-type and p-type. The layer thicknesses are determined by time and deposition rate. Typical layer thicknesses for layers 44, 46, 48, 50, and 52 may be in the range of from about 0.2 to about 2 microns.

The entire area on the substrate over which the aforementioned layers are formed will comprise the area of an array of vertical-color-filter detector groups that will be separated into individual vertical-color-filter detector groups by the isolation trench, two sides of which are shown at reference numerals 54. Persons of ordinary skill in the art will appreciate that other portions of the isolation trench necessary to define the entire periphery of vertical-color-filter detector group 40 of FIG. 7 are disposed behind and in front of the plane of the figure and thus are not seen in the figure.

As illustrated in FIG. 7, the walls defining isolation trench 54 are preferably doped with a p-type dopant (shown at reference numerals 56) to passivate leakage. The walls defining isolation trench 54 are lined with a dielectric-material passivation layer such as oxide (shown at reference numerals 58) and the trenches may be then filled with undoped polysilicon 60.

Contacts are made to the buried red (layer 46) and green (layer 50) detectors, preferably using trench structures similar to the isolation trenches. Red contact trench 62 extends into the red detector layer 46 and has its walls doped with p-type dopant 56, and is lined with a dielectric-material passivation layer 58 except at its bottom. Typical p-type dopant concentrations for trench-wall doping may be in the range of from about 1e17 to about 1e18. Typical thicknesses for the dielectric-material passivation layer may be from about 200 to about 1,000 angstroms. Red contact trench 62 is filled with n+ doped polysilicon 64. Typical n+ dopant concentrations may be in the range of from about 1e18 to about 1e20. Similarly, green contact trench 66 extends into the green detector layer 50 and has its walls doped with p-type dopant 56, and is lined with a dielectric-material passivation layer 58 except at its bottom. Green contact trench 66 is filled with n+ doped polysilicon 64.

The blue detector 68 is formed as an n+ implanted region in p-type layer 52. Typical dopant concentrations may be in the range of from about 1e17 to about 1e18. Contact is made to blue detector 68 through contact 70 using standard CMOS contact-formation processes.

The vertical-color-filter detector group depicted in FIG. 7 employs a six-layer structure, wherein the blue, green, and red photodiode sensors are disposed at different depths beneath the surface of the semiconductor structure. In comparison to the structure of the imager disclosed in U.S. Pat. No. 5,965,875 to Merrill, the addition of the extra layers results in a structure in which the red, green, and blue photocurrent signals are all taken from the n-type cathodes of three isolated photodiodes. Because all of the detector layers in vertical-color-filter detector group 40 are n-type regions, n-channel MOS transistors may be employed to form the active circuit elements for all three colors. Such n-channel MOS transistors may be formed in p-type layer 52 as shown at reference numerals 72 and 74 in FIG. 7, either within the detector region enclosed by the isolation trench, or in separate regions outside the detector regions.

Figure 8A:
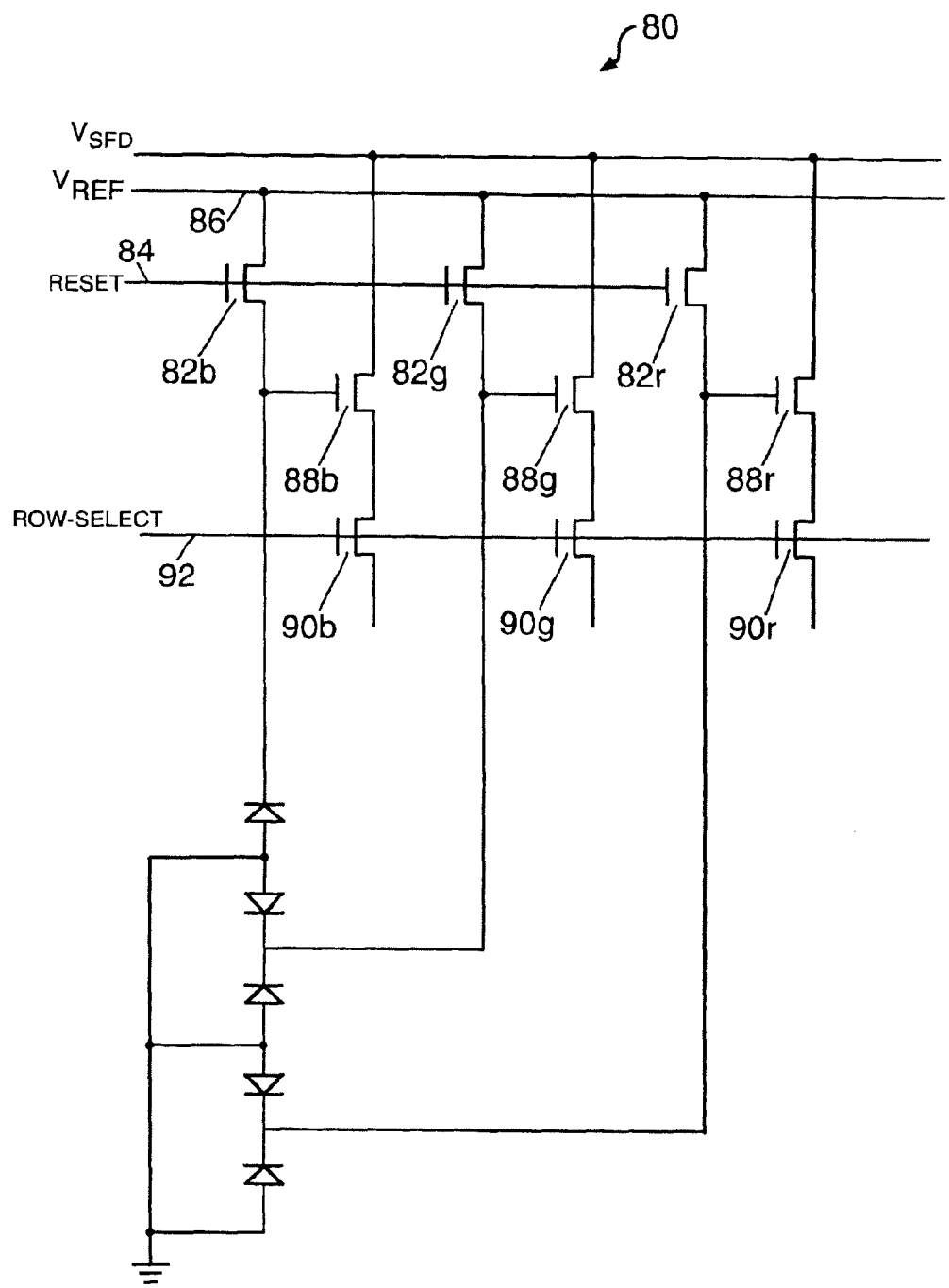

Referring now to FIG. 8A, a schematic diagram of a non-storage version 80 of a vertical-color-filter detector group is shown in which each of the red, green, and blue detectors (shown in FIG. 8A as the common cathode connections of the diodes in the lower portion of the figure) is coupled to a three-transistor circuit. Each transistor circuit has a reset transistor 82 driven from a RESET signal line 84 and coupled between its respective detector layer and a reset potential on line 86, a source-follower amplifier transistor 88 coupled to its respective detector layer, and a row-select transistor 90 driven from a ROW-SELECT signal line 92 and coupled between the source of the source-follower amplifier transistor 88 and a row line 94. The suffixes "r," "g," and "b" are used to denote the color associated with each transistor. As is known in the art, the RESET signal line 84 is active to reset the pixel and is then inactive during exposure, after which the ROW-SELECT signal line 92 is activated to read out the pixel location data.

Referring now to FIG. 8B, a schematic diagram depicts transistor circuitry that may be used in a storage version 100 of the vertical-color-filter detector group of the present invention to which each of the red, green, and blue photodiodes is coupled. As will be appreciated by persons of ordinary skill in the art, the four-transistor circuit of FIG. 8B includes an additional transfer transistor 102 not found in the circuit of FIG. 8A. The gate of transfer transistor 102 is coupled to a XFR line 104 that is held active for at least part of the time that the RESET signal line 84 is active and goes inactive at the end of the exposure time, after which the row-select signal line 92 is activated to read out the three-color data. One advantage of the circuit of FIG. 8B is that the use of the transfer transistors 102r,g,b eliminates the need for a mechanical shutter.

As shown in FIGS. 8A and 8B, the drains of source-follower amplifier transistors 88b, 88g, and 88r may be connected to a separate $V_{SFD}$ line instead of to $V_{ref}$ potential used as the reset potential at line 86. The voltage potential $V_{SFD}$ may be held fixed at a supply voltage V+ (which may be, for example, about 1–3 volts depending on the technology) or may be pulsed.

To increase input-to-output voltage gain of source-follower transistors 88b, 88g, and 88r, it is possible to pulse their drain terminals. If the $V_{SFD}$ signal at the drains of the source-follower transistors 88b, 88g, and 88r is pulsed, current will flow only when it is high. It may be advantageous to pulse the drains of the source-follower transistors 88b, 88g, and 88r with a low duty cycle to save power during exposure. Pulsing the drains of the source-follower transistors 88b, 88g, and 88r also keeps the photodiode voltages lower during the time that the drain is low, which can beneficially reduce voltage-dependent leakage at those nodes.

Figure 9A:
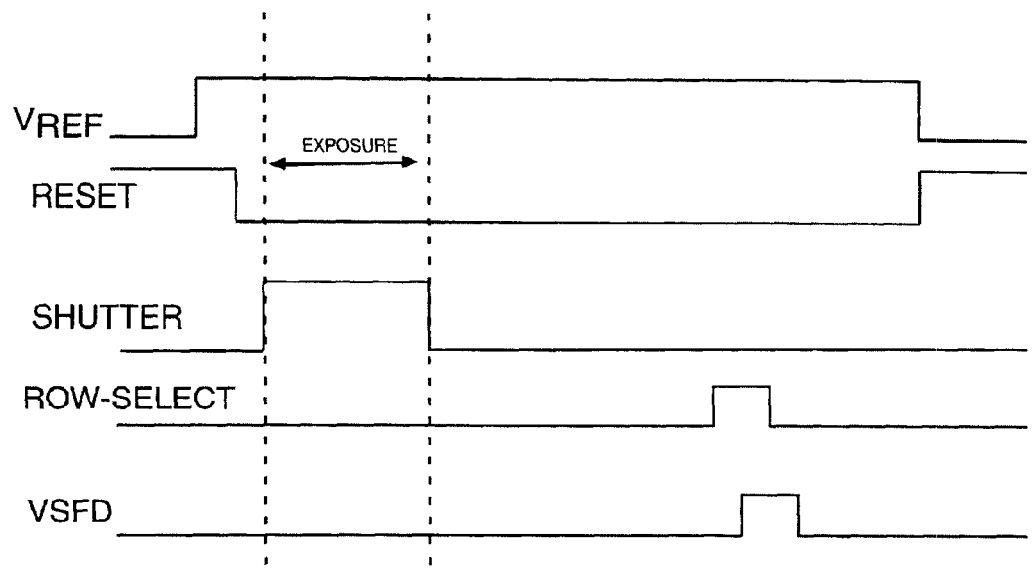
FIGS. 9A and 9B are timing diagrams showing the operation of pixel sensors shown in FIGS. 8A and 8B.

Referring now to FIG. 9A, a timing diagram illustrates one method for operating the sensor group realization of 8A. Initially, the RESET signal 84 is asserted high. The drains of the reset transistors 82b, 82g, and 82r are brought to the voltage $V_{ref}$. This action resets all vertical-color-filter detector groups in the array by placing the voltage potential $V_{ref}$ at the cathode of each photodiode. According to one method for operating the vertical-color-filter detector groups of the present invention illustrated in 9A, the voltage $V_{ref}$ is initially at a low level (e.g. to zero volts) while the RESET is high to reset cathode voltages of all photodiodes in the array to a low value to quickly equalize their states. Then the voltage $V_{ref}$ is raised (e.g. to about 2 volts) for a predetermined time (preferably on the order of a few milliseconds) while the RESET signal is asserted to allow the photodiodes in all vertical-color-filter detector groups to charge up to about 1.4 volts. The black level at the photodiode cathodes is thus set to $V_{ref}$, less a little for capacitive turn-off transient from reset transistors.

After the RESET signal 84 falls, exposure can begin; however, since without the XFR switch the active pixel sensor does not have electronic shutter capability, it may be the case that a mechanical shutter is used to control exposure. Accordingly, a SHUTTER signal is shown, indicative of a time when a shutter is letting light fall on the sensor. After the shutter closes, the RESET signal 84 is not re-asserted as it is in the circuit of FIG. 8B, since the signal needs to remain stored on the photodiode cathodes until after readout. Readout using ROW-SELECT and $V_{SFD}$ works as will be described with respect to FIG. 9B. After readout, $V_{ref}$ and RESET can be cycled back to their initial states.

As is well known in the art, there are other methods of operating three-transistor active-pixel-sensor arrays to avoid the need for a shutter.

Figure 9B:
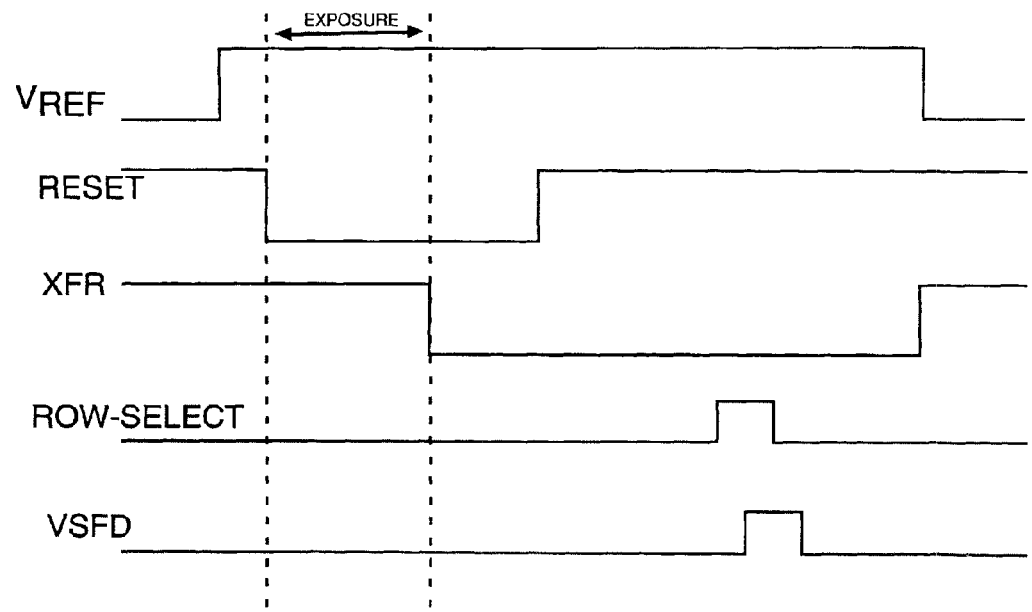

Referring now to FIG. 9B, a timing diagram illustrates the operation of the embodiment of the vertical-color-filter groups shown in 8B of the present invention. The reset operation proceeds as described relative to FIG. 9A.

When the reset signal on line 84 is de-asserted and photo integration begins, charge accumulates on the photodiode cathodes. The voltage at the source of the source-follower transistors 88b, 88g, and 88r, follows the voltage on their gates. In embodiments of the present invention that employ transfer transistors 102b, 102g, and 102r, the XFR signal 104 is asserted throughout the reset period and is de-asserted to end the integration period. The low level of the XFR signal 104 is preferably set to zero or a slightly negative voltage, such as about −0.2 volts, to thoroughly turn off transfer transistors 102b, 102g, and 102r.

To read out a pixel sensor, the drains of the source-follower transistors 88b, 88g, and 88r are driven to voltage $V_{SFD}$, the ROW-SELECT signal 92 for the row of the array containing the transistors 90b, 90g, and 90r is asserted, and the output signal is thereby driven onto COLUMN OUT lines. The timing of the assertion of the $V_{SFD}$ signal is not critical, except that it should remain high until after the ROW-SELECT signal 92 is de-asserted as illustrated in FIG. 9B. It may be advantageous to limit the voltage slope at the rising edge of the ROW-SELECT signal 92 if $V_{SFD}$ is raised first, as disclosed in U.S. Pat. No. 6,410,899.

The control signals depicted in FIGS. 9A and 9B may be generated using conventional timing and control logic. The configuration of the timing and control logic circuit will depend on the particular embodiment of this invention, but in any event will be conventional circuitry, the particular design of which is a trivial task for persons of ordinary skill in the art having examined FIGS. 9A and 9B once a particular embodiment of this invention is selected.

There are several advantages obtained by use of the vertical-color-filter detector group of this invention. First, only NMOS transistors are used in the sensing circuitry, which compared to a structure that would use opposite polarity transistors of green channel, has one half the control wires for a given pixel configuration, and occupies much less space because n-wells are not needed for PMOS devices as in prior-art schemes. The simplest pixel support needed for the vertical-color-filter detector group of the present invention requires only a total of six array wires running across the sensors.

From the disclosure of this illustrative embodiment of the three-color-vertical-color-filter detector group of the present invention, persons of ordinary skill in the art will recognize that additional colors and/or other colors may be sensed according to the present invention by adding additional layers and/or changing the junction depths.

In addition, the re is no image lag associated with the barrier gate mode that is sometimes used with pixel sensors. There i s no interaction between red, green, and blue photodiodes because of the isolation between sensors provided by the alternating-polarity diodes present in the structure.

None of the problems associated with complementary array support circuits, such as phase lag associated with digital and analog level shifters, are present in the pixel sensor of the present invention. Finally, the junction depths of each pixel sensor of the present invention may be more closely matched to the optimal junction depths of absorption of the red, green, and blue wavelengths, as shown in Table 1.

TABLE 1 junction depths for blue, green, and red detectors

| Color | Wavelength | Optimal junction depth | Triple-Well CMOS | Present Invention |
|---|---|---|---|---|
| Blue | 450 | 0.1–0.4 | 0.15 | 0.1–0.4 |
| Green | 550 | 0.8–1.2 | 0.5 | 0.8–1.2 |
| Red | 650 | 1.5–3.5 | 1.1 | 1.5–3.5 |

From the disclosure herein, those skilled in the art will recognize that there are numerous ways to realize the vertical-color-filter detector group of the present invention in a semiconductor structure. In one illustrative embodiment of this invention, illustrated in FIGS. 10A through 10L, the six-layer structure of alternating p-type and n-type regions can be formed using a semiconductor substrate 110 of a first conductivity type (e.g., p-type) as the bottom layer.

Figure 10A:
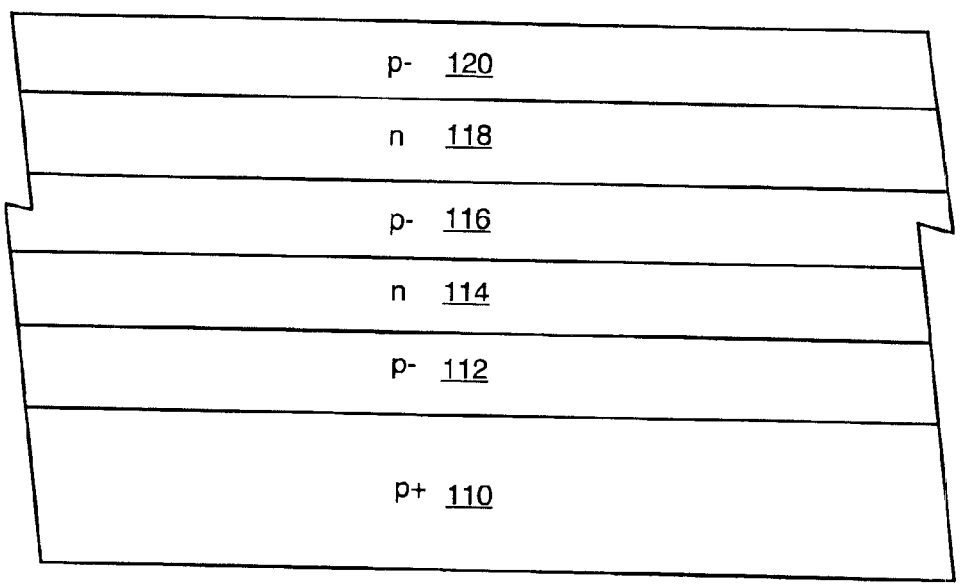
FIGS. 10A through 10K are cross-sectional diagrams showing the structure resulting after completion of selected steps in a fabrication process for the present invention.

Referring now to FIG. 10A, a layer 112 of the first conductivity type is formed over substrate 110. A layer 114 of a second conductivity type opposite that of the first conductivity type (e.g., n-type) is then formed over the layer 112. A layer 116 of the first conductivity type is then formed over the layer 114. A layer 118 of the second conductivity type is then formed over the layer 116. A layer 120 of the first conductivity type is then formed over the layer 118. As previously noted herein, one way to form this multi-layer structure is by epitaxial deposition in a single pass wherein the gas flow is changed back and forth between n-type and p-type. FIG. 10A shows the structure resulting after these processing steps have been performed.

Figure 10B:
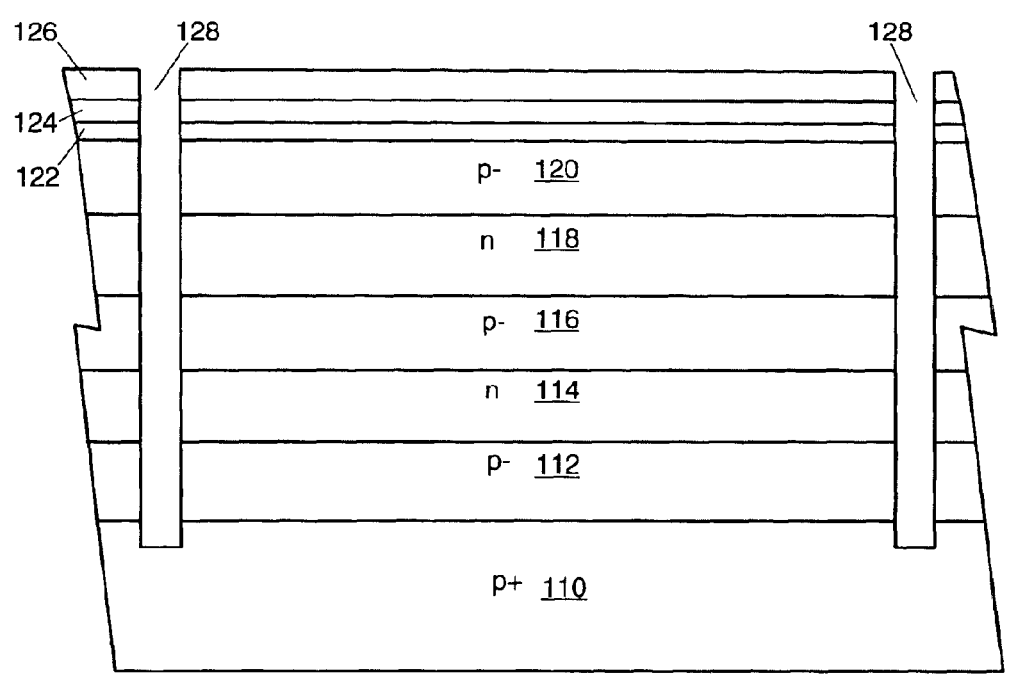

Referring now to FIG. 10B, a layer of oxide 122, a layer of nitride 124 and a photomask 126 are applied to the surface of layer 120 and developed using conventional photolithography steps, patterning the nitride layer into a hard mask to be used for the trench etching. Isolation trench 128 is then formed by etching to a depth that extends into substrate 110. Persons of ordinary skill in the art will appreciate that trench 128 defines the periphery of the vertical-color-filter detector. FIG. 10B shows the structure resulting after these processing steps have been performed.

Figure 10C:
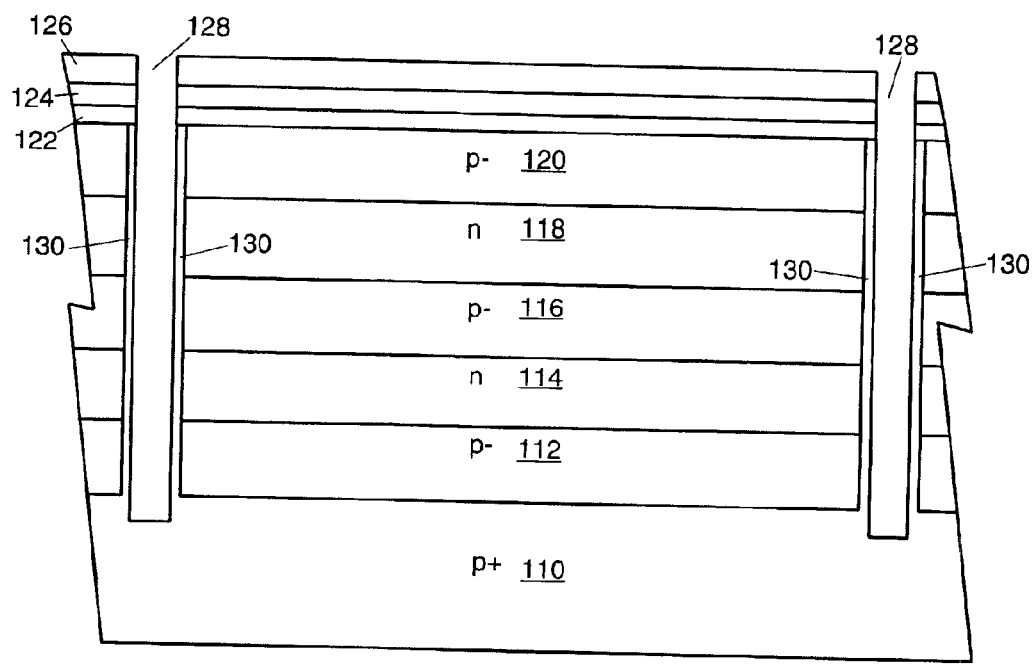

Referring now to FIG. 10C, the walls defining isolation trench 128 are then doped to passivate leakage with a first-conductivity-type dopant 130. FIG. 10C shows the structure resulting after these processing steps have been performed.

Figure 10D:
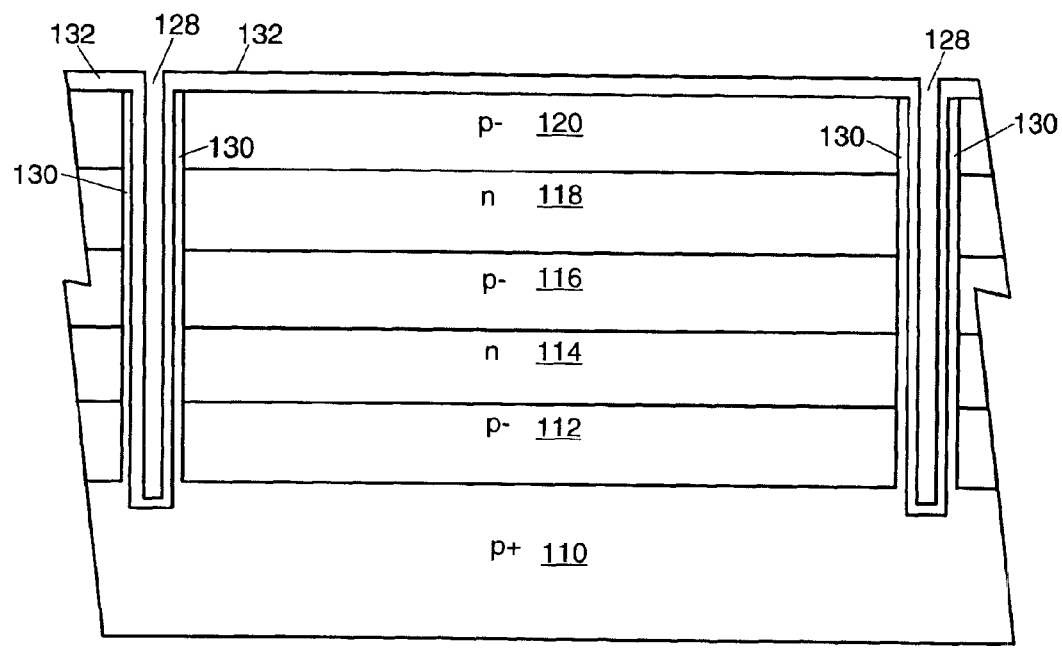

Referring now to FIG. 10D, the photomask 126 and nitride layer 124 are removed and a passivation layer 132 such as an oxide is grown in isolation trench 128. FIG. 10D shows the structure resulting after these processing steps have been performed.

Figure 10E:
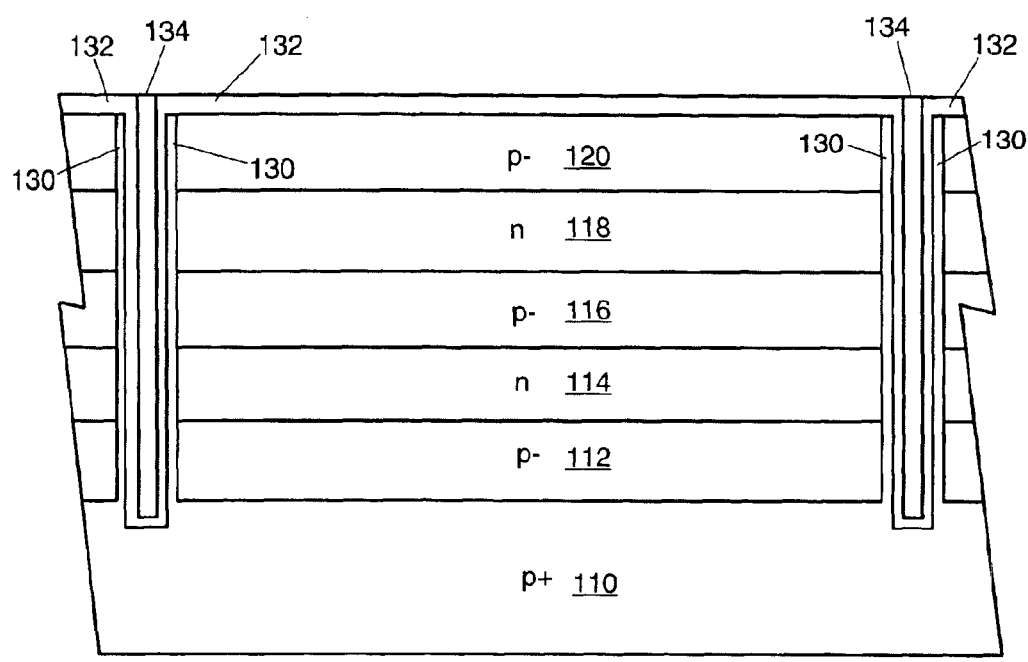

Referring now to FIG. 10E, isolation trench 128 is filled with a material 134 such as undoped polysilicon. FIG. 10E shows the structure resulting after these processing steps have been performed.

Figure 10F:
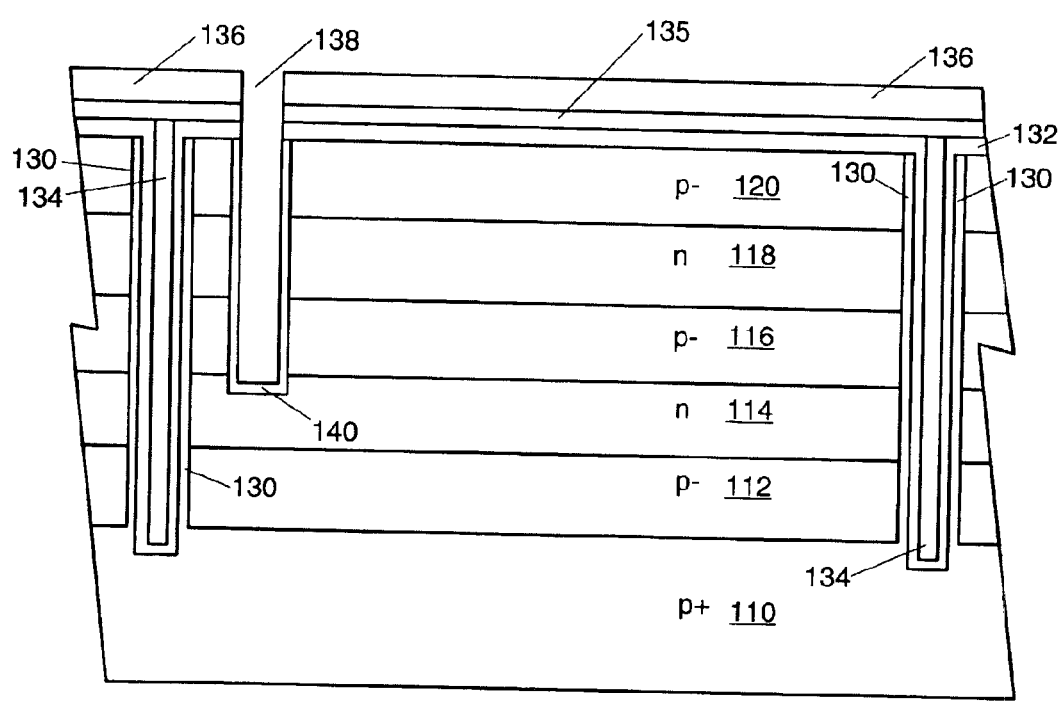

Referring now to FIG. 10F, a photomask 136 is applied to the oxide layer 132 and nitride layer 135 and developed using conventional photolithography steps, and a red contact trench 138 is then etched to a depth that extends into layer 114. The walls defining red contact trench 138 are then doped to passivate leakage with a first conductivity type dopant 140. FIG. 10F shows the structure resulting after these processing steps have been performed.

Figure 10G:
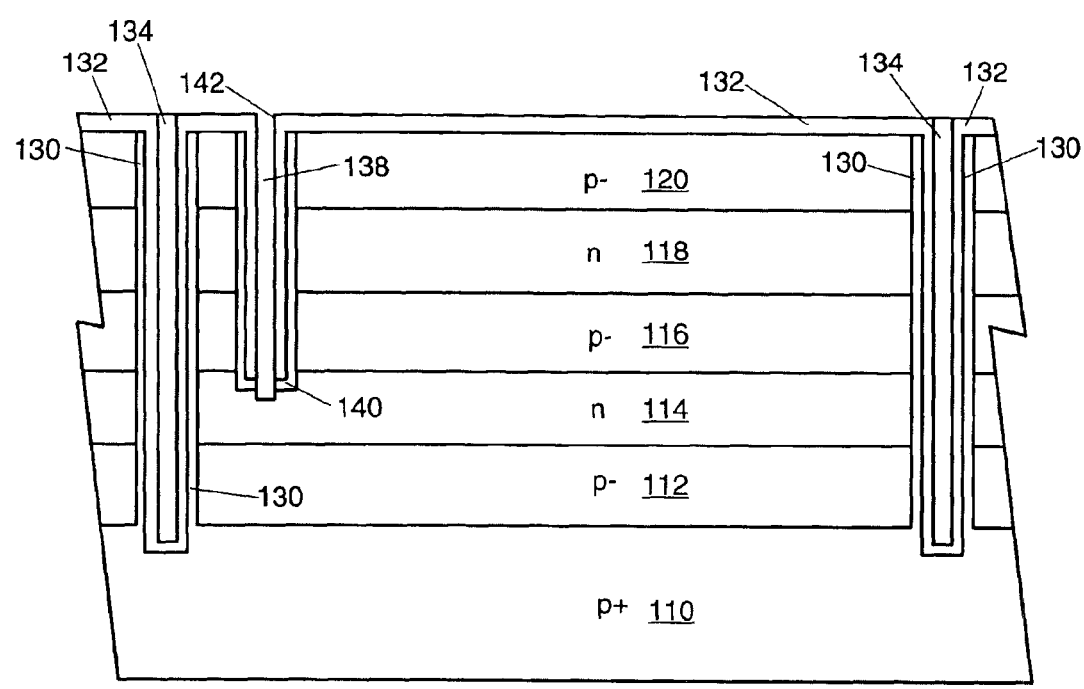

Referring now to FIG. 10G, the photomask 136 is stripped and a passivation layer 142 such as an oxide is grown on the walls defining red contact trench 138. An anisotropic etch is performed to open the bottom of the trench 138. FIG. 10G shows the structure resulting after these processing steps have been performed.

Figure 10H:
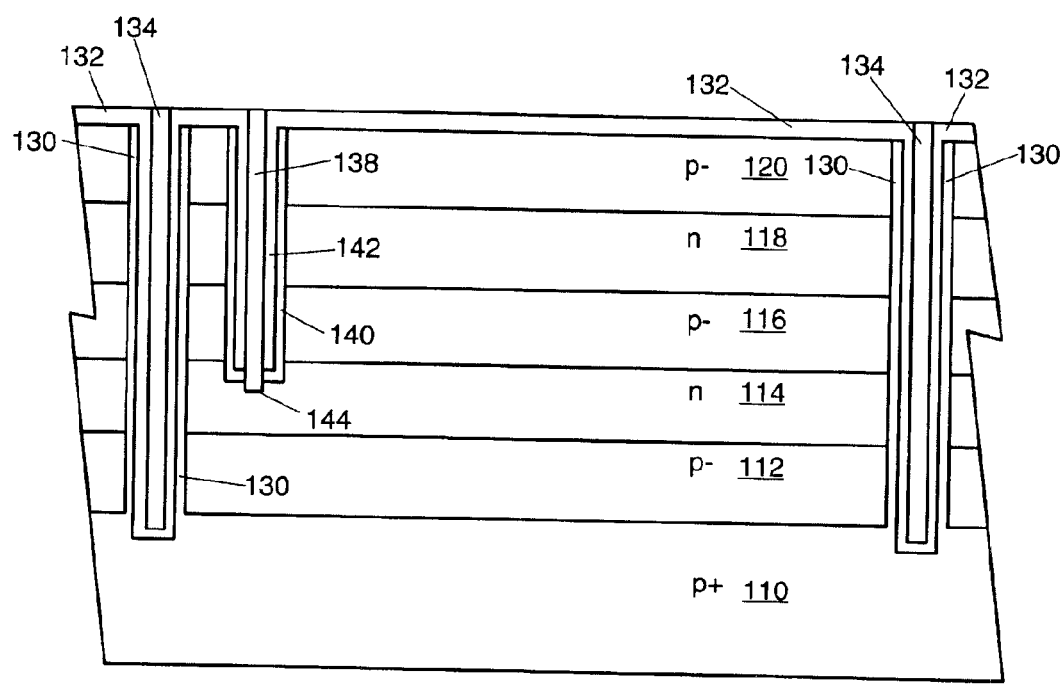

Referring now to FIG. 10H, the red contact trench 138 is then filled with a second-conductivity-type doped polysilicon 144. FIG. 10H shows the structure resulting after this processing step has been performed.

Figure 10I:
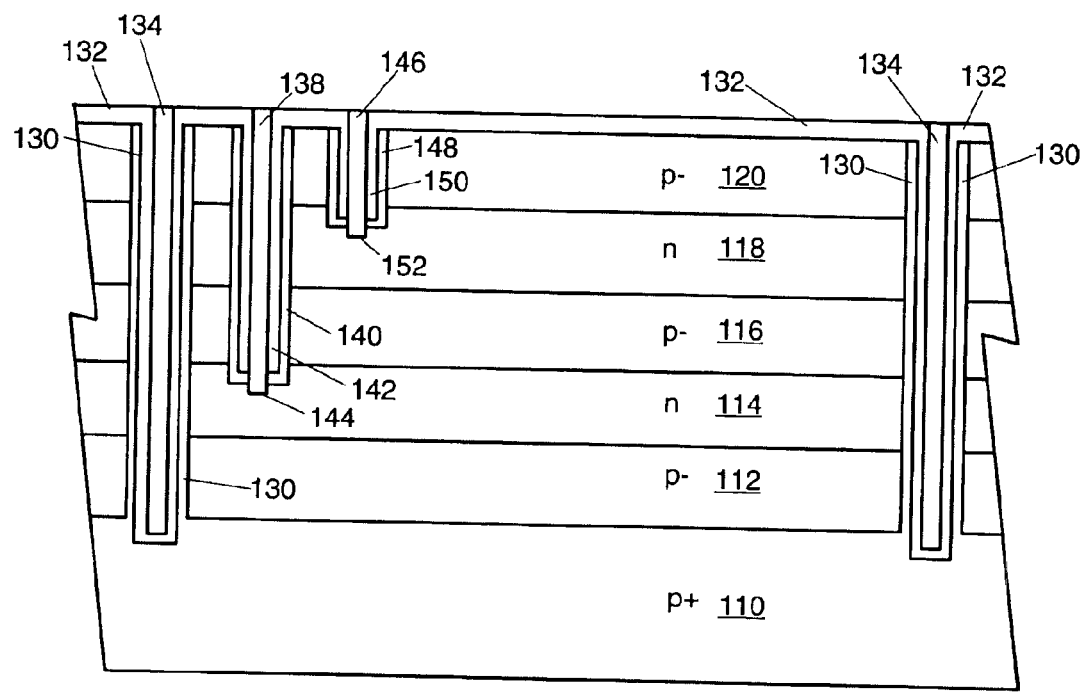

Referring now to FIG. 10I, a green contact trench 146 is then formed and processed in the same manner as described for red contact trench 138 by doping its walls to passivate leakage with a first conductivity type dopant 148, lining it with a passivation layer 150, and filling it with a second-conductivity-type dopant 152, except that green contact trench 146 and the contact 152 formed from a second-conductivity-type dopant extends into layer 118. FIG. 10I shows the structure resulting after the processing steps necessary to form this structure have been performed.

Figure 10J:
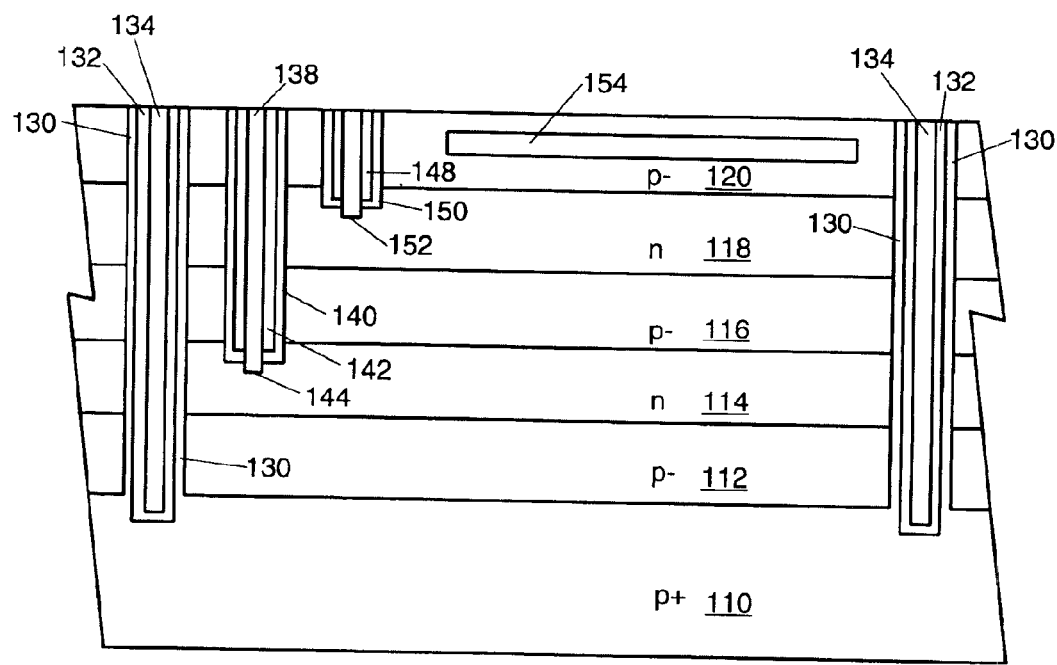

Referring now to FIG. 10J, the surface of layer 120 is polished back to restore its surface flatness using conventional techniques. A second-conductivity-type implant 154 is then performed to form the blue detector. FIG. 10J shows the structure resulting after these processing steps have been performed. The blue detector layer 154 can be a buried layer, as shown in FIG. 10J, or it may be an ordinary surface layer such as a CMOS source/drain or ldd implant. It may be patterned in a separate step as described here, or may be formed later as part of the conventional CMOS processing that follows.

Figure 10K:
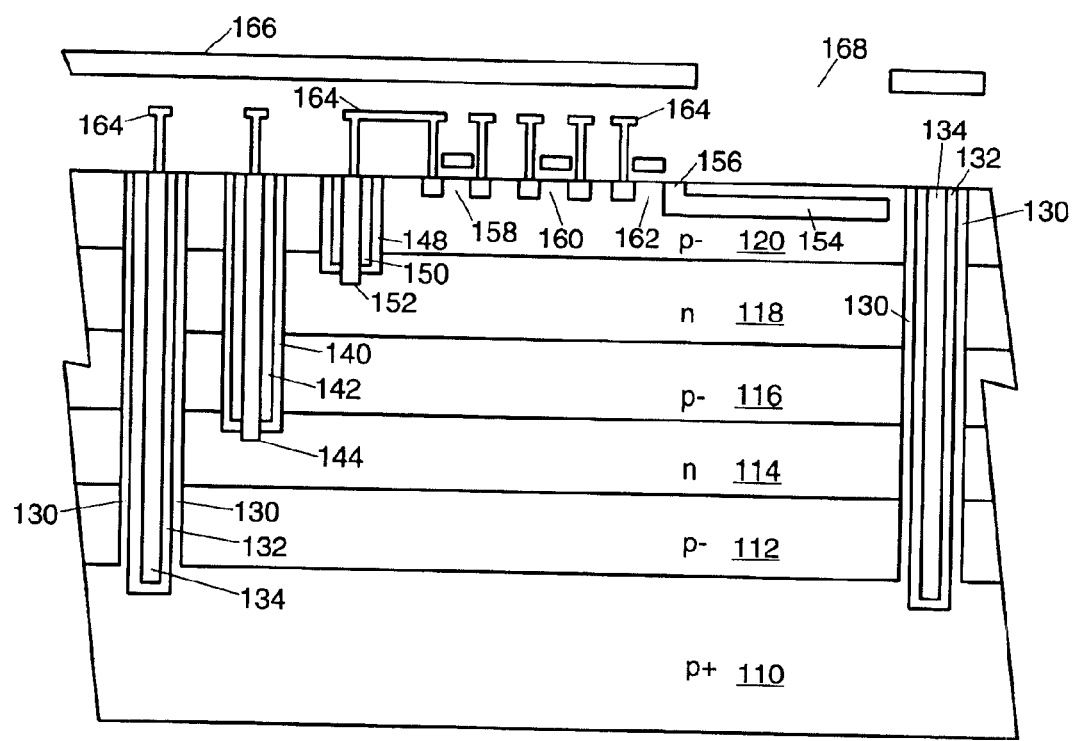

Referring now to FIG. 10K, conventional processing steps are performed to form a contact 156 to the blue detector 154.

The implant for contact 156 may preferably be one of the implants used in the normal CMOS processing steps. Normal CMOS processing steps are performed to form n-channel transistors 158, 160, and 162 in layer 120, and to form metal interconnects 164 to the transistors and to the red and green contacts. A light shield 166 is then formed with an aperture 168 as shown to direct incoming light to the desired portion of the structure. FIG. 10K shows the structure resulting after this processing step has been performed.

Figure 11A:
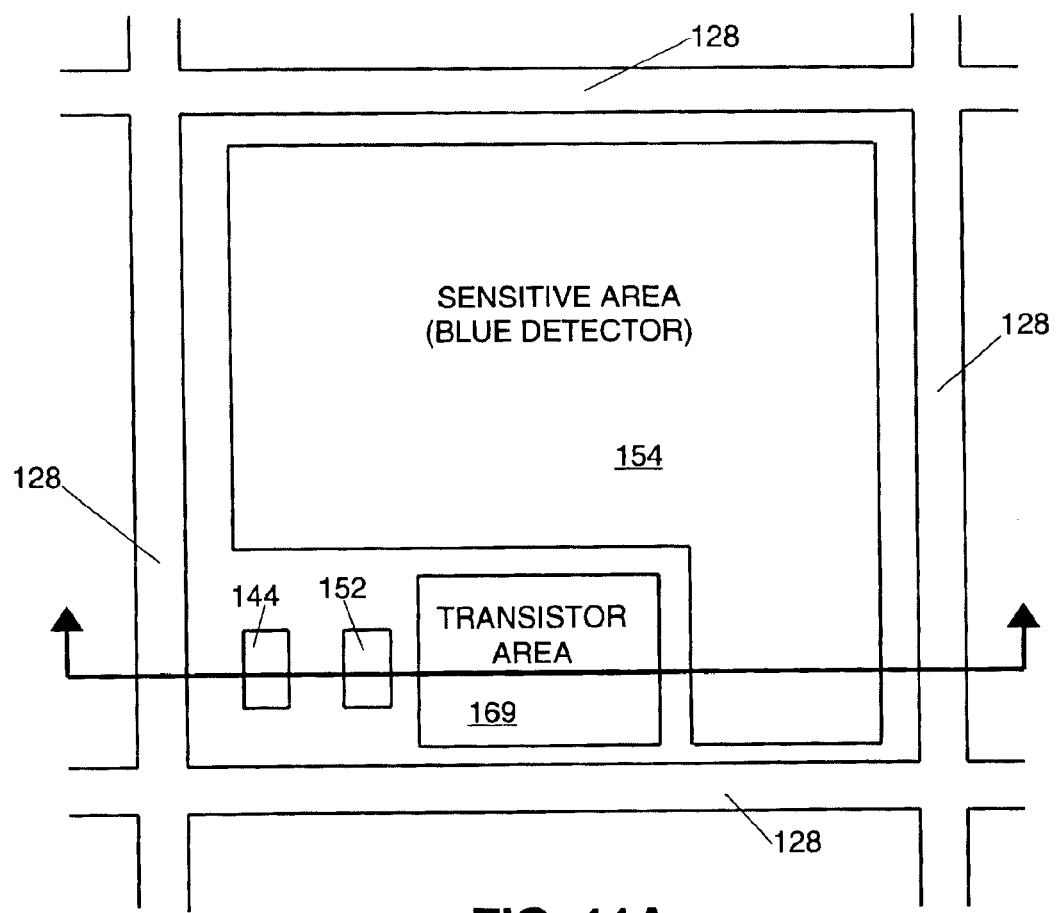
FIGS. 11A and 11B are top views of the structure including the cross-section shown in FIG. 10K, and illustrate alternate transistor placement according to the present invention.
Figure 11B:
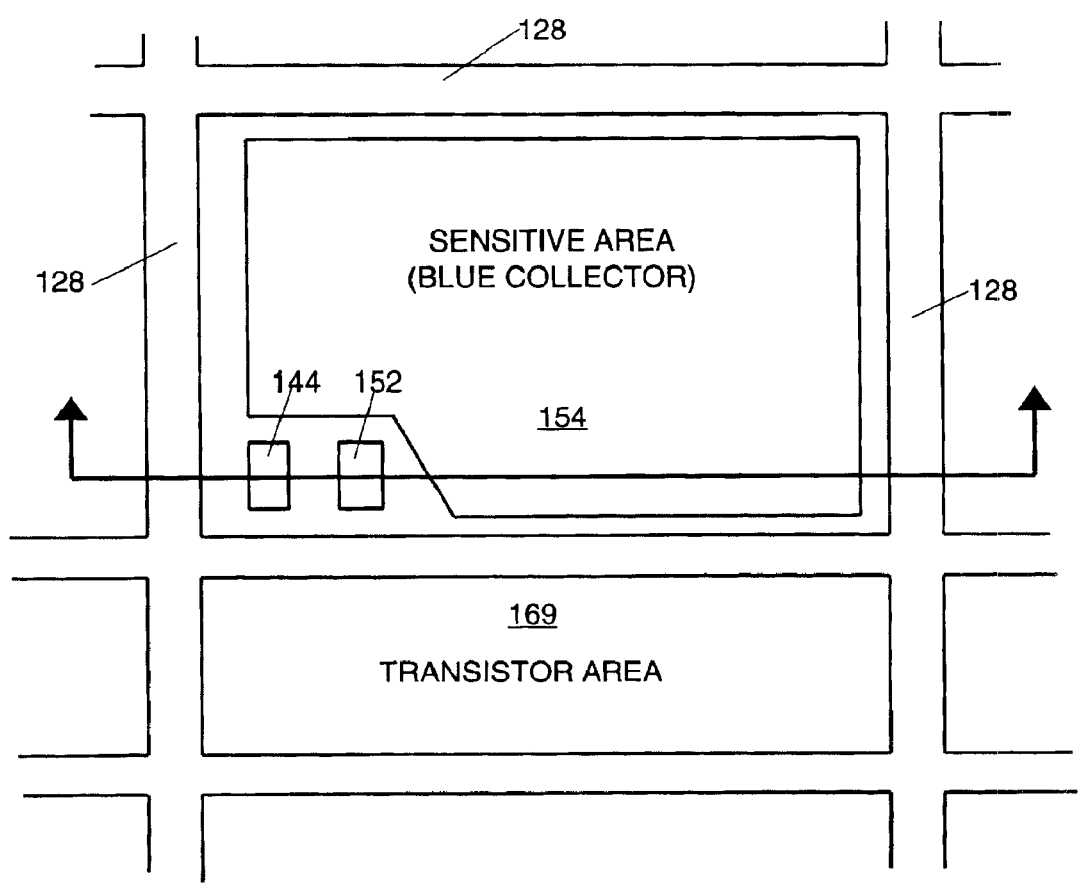

According to the present invention, the transistors 158, 160, and 162 may be formed in the sensor region itself, or may be formed in a separate trench-isolated region as shown in FIGS. 11A and 11B. Referring now to FIG. 11A, blue detector region 154 is shown within the boundary formed by peripheral isolation trench 128, the left and right portions of which are depicted in FIGS. 10A through 10K. The tops of red and green detector contacts 144 and 152 are also seen in FIG. 11A. In the embodiment depicted in FIG. 11A, transistors 158, 160, and 162 are formed in transistor region 169.

Referring now to FIG. 11B, the transistors 158, 160, and 162 may be formed in a separate trench isolation region. Blue detector region 154 is shown within the boundary of the vertical-color-filter detector group formed by peripheral isolation trench 128, the left and right portions of which are depicted in FIGS. 10A through 10K. The tops of red and green detector contacts 144 and 152 are also seen in FIG. 11B lying within the boundary of the vertical-color-filter detector group. In the embodiment depicted in FIG. 11B, transistors 158, 160, and 162 are formed in transistor region 169, which is seen to actually lie forward from the plane of the cross-section of FIG. 10K, outside of the boundary of the vertical-color-filter detector group and within a separate trench isolation region.

As may be seen from the above recited illustrative examples, other embodiments of the six-layer structure disclosed herein are contemplated to be within the scope of the present invention and may be realized by using various combinations of layers selected from among the substrate, one or more epitaxal layers, and one or more doped regions disposed in one or more epitaxial layers.

The process employed for fabricating the vertical filter sensor group of the present invention is compatible with standard CMOS processes. The additional process steps are all performed prior to the standard CMOS steps, thus minimizing interactions.

The masking, implanting, drive-in and anneal, epitaxial growth, and trench-formation fabrication process steps described above for fabricating the novel structure disclosed herein are individually well known to persons of ordinary skill in semiconductor processing art for fabricating other semiconductor devices. Process parameters, such as times, temperatures, reactant species, etc. will vary between individual processes but are known for use in such processes. Such details will not be recited herein to avoid overcomplicating the disclosure and thus obscuring the invention.

The fabrication process disclosed herein provides several advantages. There are no large lateral diffusions associated with implant and drive wells, resulting in a smaller pixel area. The trench contacts needed to connect buried layers can be small.

Figure 12:
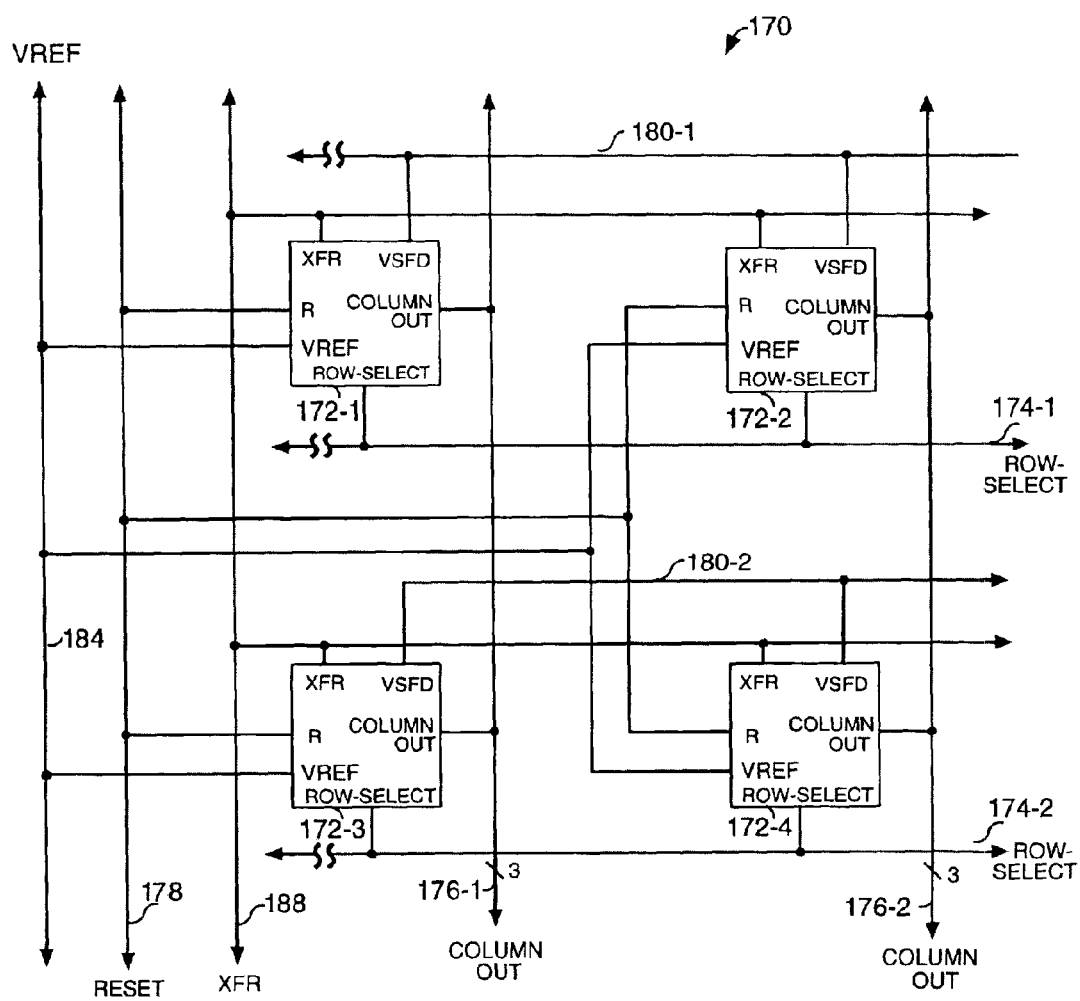
FIG. 12 is a diagram of an array of vertical-color-filter detector groups in accordance with this invention.

Referring now to FIG. 12, a diagram shows an illustrative 2 by 2 portion 170 of an array of vertical-color-filter detector groups that may be used in accordance with the present invention. Persons of ordinary skill in the art will readily appreciate that the array portion disclosed in FIG. 12 is illustrative only and that arrays of arbitrary size may be fabricated using the teachings herein. The illustrative array example of FIG. 12 employs circuitry with a storage feature such as is depicted in FIG. 8B including a transfer transistor and so includes a global transfer signal line serving the array. Persons of ordinary skill in the art will appreciate that arrays employing circuitry similar to that depicted in FIG. 8A without storage and thus without a transfer transistor are also contemplated as within the scope of the present invention and that such arrays will not include a transfer signal line.

Common RESET and XFR lines can be provided for all of the vertical-color-filter detector groups in the array. As presently preferred a separate VSFD line is provided for each row in the array, although embodiments of the present invention having a single VSFD node are also contemplated. For an example of a VSFD line used in a vertical-color-filter array refer to U.S. Pat. No. 6,410,899. The source of the row-select transistor for each color in FIGS. 8A and 8B in a column of the array will be coupled to a separate column line associated with that column and the gate of all row-select transistors for all colors for each vertical-color-filter detector group in a row of the array will be coupled to ROW-SELECT line associated with that row.

The 2 by 2 portion 170 of the array in FIG. 12 includes two rows and two columns of vertical-color-filter detector groups. A first row includes vertical-color-filter detector groups 172-1 and 172-2; a second row includes vertical-color-filter detector groups 172-3 and 172-4. A first column includes vertical-color-filter detector groups 172-1, 172-3; a second column includes vertical-color-filter detector groups 172-2 and 172-4.

A first ROW-SELECT line 174-1 is connected to the row-select inputs (ROW-SELECT) of vertical-color-filter detector groups 172-1 and 172-2. A second ROW-SELECT line 174-2 is connected to the row-select inputs (ROW-SELECT) of vertical-color-filter detector groups 172-3 and 172-4. The first and second ROW-SELECT lines may be driven from a row decoder (not shown) as is well known in the art.

A first set of three (blue, green, and red) COLUMN-OUT lines 176-1 is connected to the outputs of vertical-color-filter detector groups 172-1 and 172-3. A second set of three COLUMN-OUT lines 176-2 is connected to the outputs of vertical-color-filter detector groups 172-2 and 172-4. The first and second sets of COLUMN OUT lines are coupled to sets of column readout circuits (not shown) as is well known in the art.

A global RESET line 178 is connected to the reset (R) inputs of all of the vertical-color-filter detector groups 172-1 through 172-4. A first VSFD line 180-1 is connected to the VSFD inputs of the vertical-color-filter detector groups 172-1 and 172-2 in the first row of the array. A second VSFD line 180-2 is connected to the VSFD inputs of the vertical-color-filter detector groups 172-3 and 172-4 in the second row of the array. A global XPR line 182 is connected to the XFR inputs of all of the vertical-color-filter detector groups 172-1 through 172-4.

A global $V_{ref}$ line 184 is connected to the $V_{ref}$ inputs of all of the vertical-color-filter detector groups 172-1 through 172-4. Alternately, multiple $V_{ref}$ lines (e.g., one for each column) could be provided.

Figure 13:
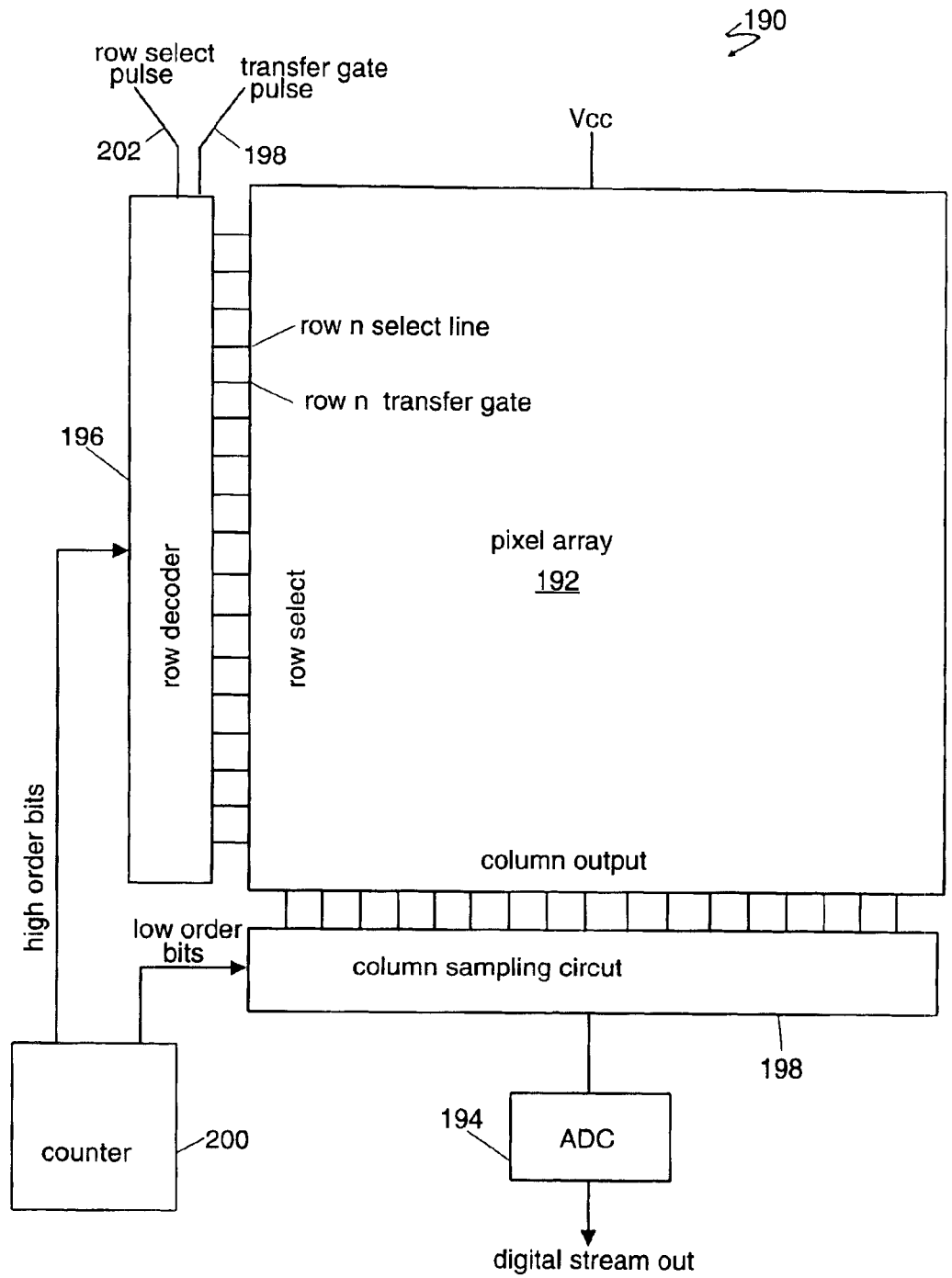
FIG. 13 is a block diagram of an illustrative imager employing vertical-color-filter detector groups in accordance with this invention.

FIG. 13 is a block diagram of an illustrative imager 190 suitable for use in accordance with this invention employing an array of active vertical-color-filter detector groups as disclosed herein. In the imager 190, the active pixel sensors are arranged in rows and columns in pixel array sensor 192 to extract the analog pixel information from the pixel sensor array 192 for processing by Analog-to-Digital Converter (ADC) 184. Row-decoder circuit 196, column-sampling circuit 198 and counter 200 are also employed. Row-decoder circuit 186 selects rows from pixel-sensor array 192 in response to a row-enable signal 202 and signals from counter 200. The column sampling circuit 198 is also driven from the counter 200 and further includes a multiplexer that couples the sampled columns as desired to ADC 194 in response to signals from counter 200.

In a typical implementation, the higher-order bits from counter 190 are used to drive row-decoder circuit 196 and the lower-order bits are used to drive column-sampling circuit 198 to permit the extraction of all pixel information from a row in pixel-sensor array 192, prior to selection of the next row by row-decoder circuit 196. Row decoders, column-sampling circuits with embedded multiplexers, and counters suitable for use in imager 190 are well known to those of ordinary skill in the art and will not be described herein to avoid overcomplicating the disclosure and thereby obscuring this invention.

Figure 14:
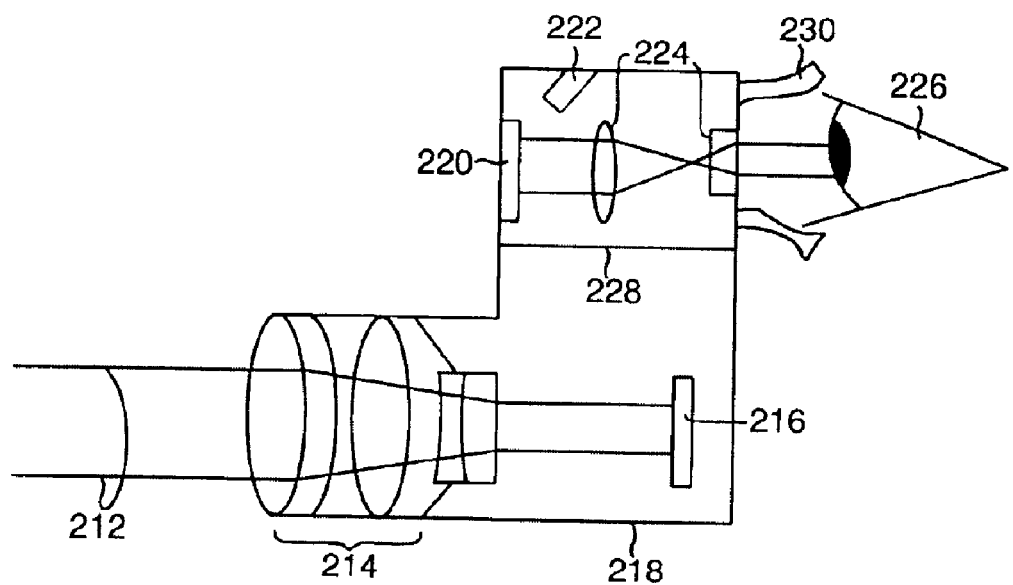
FIG. 14 is a block diagram of an illustrative embodiment of an image capture and display system in accordance with this invention.

Referring now to FIG. 14, a block diagram shows an illustrative embodiment of an image capture and display system 210 in accordance with this invention. Rays of light 212 from a scene to the left of the figure are focused by primary optical system 214 onto a sensor chip 216 containing an array of active vertical-color-filter detector groups according to the present invention. Optical system 214 and sensor chip 216 are housed within light-tight housing 218 to prevent stray light from falling on sensor chip 216 and thereby corrupting the image formed by rays 212. An electronic system, not illustrated in FIG. 13, takes electrical signals from sensor chip 216 and derives electrical signals suitable for driving display chip 220, which can be either of the micro-machined reflective type as supplied by Texas Instruments, or of the liquid-crystal coated type, as supplied by micro-display vendors such as Kopin, MicroDisplay Corp. or Inviso.

Display chip 220 is illuminated by light-emitting-diode (LED) array 222. Reflected light from display chip 220 is focused by secondary optical system 224 in such a manner that images can be viewed by the eye 226 of the user of the camera. Alternatively, display chip 210 can be an organic light-emitting array, in which it produces light directly and does not require LED array 222. Both technologies give bright displays with excellent color saturation and consume very little power, thus being suitable for integration into a compact camera housing as illustrated in FIG. 9. A light-tight baffle 228 separates the chamber housing sensor chip 216 from that housing LED array 222, display chip 220, and secondary optical system 224. Viewing the image from display chip 220 in bright sunlight is made easier by providing rubber or elastomer eye cup 230.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A vertical-color-filter detector group comprising:
   a semiconductor body including a plurality of alternating silicon layers of first and second conductivity types, said second conductivity type opposite that of said first conductivity type, formed over a substrate, each of said layers of second conductivity type being disposed at a different depth from an upper surface of said silicon body, there being at least first and second said layers of said second conductivity type;
   first and second conductive contacts extending, respectively, from said first and second layers of said second conductivity type to said upper surface of a silicon body; and
   a peripheral isolation trench defining a perimeter of said detector group, wherein said peripheral isolation trench is filled with undoped polysilicon.

2. The vertical-color-filter detector group of claim 1 wherein said peripheral isolation trench is filled with polysilicon doped to said first conductivity type.

3. A vertical-color-filter detector group comprising:
   a semiconductor body including a plurality of alternating silicon layers of first and second conductivity types, said second conductivity type opposite that of said first conductivity type, formed over a substrate of said first conductivity type, each of said layers of said second conductivity type being disposed at a depth from an upper surface of a silicon body selected to preferentially absorb radiation of a selected color, there being at least first and second said layers of said second conductivity type;
   a peripheral isolation trench defining a perimeter of said detector group;
   a first contact trench formed in said silicon body within said Perimeter to a depth to contact said first layer of said second conductivity type, walls defining said first contact trench doped to said first conductivity type and lined with an insulating material, said first contact trench filled with a filler material of a second conductivity type such that said filler material extends from said upper surface to said first layer of said second conductivity type and electrically contacts only said first layer of said second conductivity type;
   a second contact trench spaced apart from said first contact trench and formed in said silicon body within said perimeter to a depth to contact said second layer of said second conductivity type, walls defining said second contact trench doped to said first conductivity type and lined with an insulating material, said second contact trench filled with filler material of said second conductivity type such that said filler material extends from said upper surface to said second layer of said second conductivity type and electrically contacts only said second layer of said second conductivity type.

4. The vertical-color-filter detector group of claim 3, wherein walls defining said peripheral isolation trench are doped to said first conductivity type.

5. The vertical-color-filter detector group of claim 3 wherein said peripheral isolation trench is filled with an insulating material.

6. The vertical-color-filter detector group of claim 3 wherein said peripheral isolation trench is filled with undoped polysilicon.

7. The vertical-color-filter detector group of claim 3 wherein said peripheral isolation trench is filled with polysilicon doped to said first conductivity type.

8. A vertical-color-filter detector group in a silicon body comprising:
   a silicon substrate doped to a first conductivity type;
   a first silicon layer doped to said first conductivity type disposed over said substrate;
   a second silicon layer doped to a second conductivity type opposite of said first conductivity type disposed over said substrate;

a third silicon layer doped to said first conductivity type disposed over said second silicon layer;

a fourth silicon layer doped to said second conductivity type disposed over said third silicon layer;

a fifth silicon layer doped to said first conductivity type disposed over said fourth silicon layer;

a doped region doped to said second conductivity type disposed within said fifth silicon layer;

said second silicon layer being disposed at a depth from an upper surface of the silicon body selected to preferentially absorb radiation of red color and act as a red photodetector, said fourth silicon layer being disposed at a depth from said upper surface of said silicon body selected to preferentially absorb radiation of green color and act as a green photodetector, and said doped region being disposed at a depth from said upper surface of said silicon body selected to preferentially absorb radiation of blue color and act as a blue photodetector;

a peripheral isolation trench defining a perimeter of said detector group, said peripheral isolation trench extending from said upper surface of said silicon body into said substrate;

a first contact trench formed within said perimeter and extending from said upper surface of said silicon body into said second silicon layer, walls defining said first contact trench doped to said first conductivity type, said first contact trench lined with an insulating material and filled with filler material of said second conductivity type such that said filler material extends from said upper surface of said silicon body to said second silicon layer to form a red-detector contact;

a second contact trench spaced apart from said first contact trench and formed within said perimeter and extending from said upper surface of said silicon body into said fourth n-type silicon layer, walls defining said second contact trench doped to said first conductivity type, lined with an insulating material and filled with filler material of said second conductivity type such that said filler material extends from said upper surface of said silicon body to said fourth silicon layer to form a green-detector contact; and a contact of said second conductivity spaced apart from said first and second trenches and formed within said perimeter and extending from said upper surface of said silicon body into said doped region to form a blue-detector contact.

9. The vertical-color-filter detector group of claim 8, wherein walls defining said peripheral isolation trench are doped to said first conductivity type.

10. The vertical-color-filter detector group of claim 8 wherein said peripheral isolation trench is filled with an insulating material.

11. The vertical-color-filter detector group of claim 8 wherein said peripheral isolation trench is filled with undoped polysilicon.

12. The vertical-color-filter detector group of claim 8 wherein said peripheral isolation trench is filled with polysilicon doped to said fast conductivity type.

13. The vertical-color-filter detector group of claim 12 wherein walls defining said peripheral isolation trench are doped to p concentration.

14. The vertical-color-filter detector group of claim 13 wherein said peripheral isolation trench is filled with p-type polysilicon.

15. The vertical-color-filter detector group of claim 8 wherein said doped region is an implanted region in said fifth silicon layer.

16. A vertical-color-filter active detector group in a silicon body comprising:

a silicon substrate doped to a first conductivity type;

a first silicon layer doped to said first conductivity type disposed over said substrate;

a second silicon layer doped to a second conductivity type opposite of said first conductivity type disposed over said substrate;

a third silicon layer doped to said first conductivity type disposed over said second silicon layer;

a fourth silicon layer doped to said second conductivity type disposed over said third silicon layer;

a fifth silicon layer doped to said first conductivity type disposed over said fourth silicon layer;

a doped region doped to said second conductivity type disposed within said fifth silicon layer;

said second silicon layer being disposed at a depth from an upper surface of the silicon body selected to preferentially absorb radiation of red color and act as a red photodetector, said fourth silicon layer being disposed at a depth from said upper surface of said silicon body selected to preferentially absorb radiation of green color and act as a green photodetector, and said doped region being disposed at a depth from said upper surface of said silicon body selected to preferentially absorb radiation of blue color and act as a blue photodetector;

a peripheral isolation trench defining a perimeter of said detector group, said peripheral isolation trench extending from said upper surface of said silicon body into said substrate;

a first contact trench formed within said perimeter and extending from said upper surface of said silicon body into said second silicon layer, walls defining said first contact trench doped to said first conductivity type, said first contact trench lined with an insulating material and filled with filler material of said second conductivity type such that said filler material extends from said upper surface of said silicon body to said second silicon layer to form a red-detector contact;

a second contact trench spaced apart from said first contact trench and formed within said perimeter and extending from said upper surface of said silicon body into said fourth n-type silicon layer, walls defining said second contact trench doped to said first conductivity type, lined with an insulating material and filled with filler material of said second conductivity type such that said filler material extends from said upper surface of said silicon body to said fourth silicon layer to form a green-detector contact;

a contact of said second conductivity type spaced apart from said first and second trenches and formed within said perimeter and extending from said upper surface of said silicon body into said doped region to form a blue-detector contact;

a red-source-follower transistor of said second conductivity type formed in said fifth silicon layer and having a gate coupled to said filler material in said first trench, a drain coupled to a source-follower-drain-voltage line, and a source;

a green-source-follower transistor of said second conductivity type formed in said fifth silicon layer and having a gate coupled to said filler material in said second trench, a drain coupled to a source-follower-drain-voltage line, and a source;

a blue-source-follower transistor of said second conductivity type formed in said fifth silicon layer and having a gate coupled to said contact of said second conductivity type, a drain coupled to a source-follower-drain-voltage line, and a source.

17. The vertical-color-filter detector group of claim 16 wherein said doped region is an implanted region in said fifth silicon layer.

18. The vertical-color-filter active detector group of claim 16 further including:
a red-reset transistor coupled between a reference-voltage and said red-detector contact;
a green-reset transistor coupled between a reference-voltage and said green-detector contact;
a blue-reset transistor coupled between a reference-voltage and said blue-detector contact;
a red-output-enable transistor coupled between said source of said red-source-follower transistor and a red-column-output line, said red-source-follower transistor having a gate coupled to a row-select line;
a green-output-enable transistor coupled between said source of said green-source-follower transistor and a green column-output line, said green-source-follower transistor having a gate coupled to a row-select line; and
a blue-output-enable transistor coupled between said source of said blue-source-follower transistor and a blue-column-output line, said blue-source-follower transistor having a gate coupled to a row-select-line.

19. The vertical-color-filter detector group of claim 16 wherein walls defining said peripheral isolation trench are doped to said first conductivity type.

20. The vertical-color-filter detector group of claim 19 wherein said peripheral isolation trench is filled with an insulating material.

21. The vertical-color-filter detector group of claim 19 wherein said peripheral isolation trench is filled with undoped polysilicon.

22. The vertical-color-filter detector group of claim 19 wherein said peripheral isolation trench is filled with polysilicon doped to said first conductivity type.

23. A vertical-color-filter detector group comprising:
a semiconductor body including a plurality of alternating n-type and p-type silicon layers formed over a p+ substrate, a top of said semiconductor body being an upper surface of one of said p-type silicon layers, each of said n-type layers being disposed at a depth from said upper surface selected to preferentially absorb radiation of a selected color, there being at least first and second said n-type layers;
a peripheral isolation trench defining a perimeter of said detector group;
a first contact trench formed in said silicon body within said perimeter to a depth to contact said first n-type layer, walls defining said first contact trench doped to p concentration, said first contact trench lined with an insulating material and filled with n-type filler material such that said n-type filler material extends from said upper surface to said first n-type layer and electrically contacts only said first n-type layer;
a second contact trench spaced apart from said first contact trench and formed in said silicon body within said perimeter to a depth to contact said second n-type layer, walls defining said second contact trench doped to p concentration, said second contact trench lined with an insulating material and filled with n-type filler material such that said n-type filler material extends from said upper surface to said second n-type layer and electrically contacts only said second n-type layer.

24. The vertical-color-filter detector group of claim 23 wherein walls defining said peripheral isolation trench are doped to p concentration.

25. The vertical-color-filter detector group of claim 24 wherein said peripheral isolation trench is filled with an insulating material.

26. The vertical-color-filter detector group of claim 24 wherein said peripheral isolation trench is filled with p-type polysilicon.

27. A vertical-color-filter detector group comprising:
a p+ silicon substrate;
a first p-type silicon layer disposed over said p+ substrate;
a first n-type silicon layer disposed over said first p-type silicon layer;
a second p-type silicon layer disposed over said first n-type silicon layer;
a second n-type silicon layer disposed over said second p-type silicon layer;
a third p-type silicon layer disposed over said second n-type silicon layer;
an n-type silicon region disposed within said third p-type silicon layer;
said first n-type silicon layer being disposed at a depth from an upper surface of said detector group selected to preferentially absorb radiation of red color and act as a red photodetector, said second n-type silicon layer being disposed at a depth from said upper surface of said detector group selected to preferentially absorb radiation of green color and act as a green photodetector, and
said third n-type silicon layer being disposed at a depth from said upper surface of said detector group selected to preferentially absorb radiation of blue color and act as a blue photodetector;
a peripheral isolation trench defining a perimeter of said detector group, said peripheral isolation trench extending from said upper surface of said detector group into said p+ substrate;
a first contact trench formed within said perimeter and extending from said upper surface of said detector group into said first n-type silicon layer, walls defining said first contact trench doped to p concentration, said first contact trench lined with an insulating material and filled with n-type filler material such that said n-type filler material extends from said upper surface of said detector group to said first n-type silicon layer to form a red-detector contact;
a second contact trench spaced apart from said first contact trench and formed within said perimeter and extending from said upper surface of said detector group into said second n-type silicon layer, walls defining said second contact trench doped to p concentration, said second contact trench lined with an insulating material and filled with n-type filler material such that said n-type filler material extends from said upper surface of said detector group to said second n-type silicon layer to form a green-detector contact; and
an n-type contact spaced apart from said first and second contact trenches and formed within said perimeter and extending from said upper surface of said detector group into said third n-type silicon region to form a blue-detector contact.

28. The vertical-color-filter detector group of claim 27 wherein walls defining said peripheral isolation trench are doped to p concentration.

29. The vertical-color-filter detector group of claim 28 wherein said peripheral isolation trench-is filled with an insulating material.

30. The vertical-color-filter detector group of claim 28 wherein said peripheral isolation trench is filled with p-type polysilicon.

31. The vertical-color-filter detector group of claims 27 wherein said third n-type silicon layer is an implanted region in said third p-type silicon layer.

32. A vertical-color-filter active detector group comprising:

a p+ silicon substrate;

a first p-type silicon layer formed over said p+ substrate;

a first n-type silicon layer formed over said first p-type silicon layer;

a second p-type silicon layer formed over said first n-type silicon layer;

a second n-type silicon layer formed over said second p-type silicon layer;

a third p-type silicon layer formed over said second n-type silicon layer;

an n-type implant region formed within said third p-type silicon layer;

said first n-type silicon layer being disposed at a depth from an upper surface of said detector group selected to preferentially absorb radiation of red color and act as a red photodetector, said second n-type silicon layer being disposed at a depth from said upper surface of said detector group selected to preferentially absorb radiation of green color and act as a green photodetector, and said n-type implant region being disposed at a depth from said upper surface of said detector group selected to preferentially absorb radiation of blue color and act as a blue photodetector;

a peripheral isolation trench defining a perimeter of said detector group, said peripheral isolation trench extending from said upper surface of said detector group into said p+ substrate;

a first contact trench formed within said perimeter and extending from said upper surface of said detector group into said first n-type silicon layer, walls defining said first contact trench doped to p concentration, said first contact trench lined with an insulating material and filled with n-type filler material such that said n-type filler material extends from said upper surface of said detector group to said first n-type silicon layer to form a red-detector contact;

a second contact trench spaced apart from said first contact trench and formed within said perimeter and extending from said upper surface of said detector group into said second n-type silicon layer, walls defining said second contact trench doped to p concentration, said second contact trench lined with an insulating material and filled with n-type filler material such that said n-type filler material extends from said upper surface of said detector group to said second n-type silicon layer to form a green-detector contact;

an n-type contact spaced apart from said first and second contact trenches and formed within said perimeter and extending from said upper surface of said detector group into said n-type implant region to form a blue-detector contact;

an n-channel red-source-follower transistor formed in said third p-type silicon layer and having a gate coupled to said n-type filler material in said first trench, a drain coupled to a red-source-follower-drain-voltage line, and a source;

an n-channel green-source-follower transistor formed in said third p-type silicon layer and having a gate coupled to said n-type filler material in said second trench, a drain coupled to a green-source-follower-drain-voltage line, and a source;

an n-channel blue-source-follower transistor formed in said third p-type silicon layer and having a gate coupled to said n-type contact, a drain coupled to a blue-source-follower-drain-voltage line, and a source.

33. The vertical-color-filter active detector group of claim 32 further including:

a red-reset transistor coupled between a reference-voltage and said red-detector contact;

a green-reset transistor coupled between a reference-voltage and said green-detector contact;

a blue-reset transistor coupled between a reference-voltage and said blue-detector contact;

a red-output-enable transistor coupled between said source of said red-source-follower transistor and a red-column-output line, said red-source-follower transistor having a gate coupled to a row-select line;

a green-output-enable transistor coupled between said source of said green-source-follower transistor and a green column-output line, said green-source-follower transistor having a gate coupled to a row-select line; and a blue-output-enable transistor coupled between said source of said blue-source-follower transistor and a blue-column-output line, said blue-source-follower transistor having a gate coupled to a row-select line.

34. The vertical-color-filter detector group of claim 33 wherein walls defining said peripheral isolation trench are doped to p concentration.

35. The vertical-color-filter detector group of claim 34 wherein said peripheral isolation trench is filled with an insulating material.

36. The vertical-color-filter detector group of claim 34 wherein said peripheral isolation trench is filled with p-type polysilicon.

37. The vertical-color-filter detector group of claim 33 wherein said third n-type silicon layer is an implanted region in said third p-type silicon layer.

* * * * *